US011495146B2

(12) United States Patent
Niibori

(10) Patent No.: US 11,495,146 B2
(45) Date of Patent: Nov. 8, 2022

(54) LED DISPLAY

(71) Applicant: K Design Project Co., Ltd., Tokyo (JP)

(72) Inventor: Yasuhiro Niibori, Tokyo (JP)

(73) Assignee: K Design Project Co., Ltd., Tokyo (JP)

( * ) Notice: Subject to any disclaimer, the term of this patent is extended or adjusted under 35 U.S.C. 154(b) by 434 days.

(21) Appl. No.: 16/606,304

(22) PCT Filed: Apr. 23, 2018

(86) PCT No.: PCT/JP2018/016415
§ 371 (c)(1),
(2) Date: Oct. 18, 2019

(87) PCT Pub. No.: WO2018/199006
PCT Pub. Date: Nov. 1, 2018

(65) Prior Publication Data
US 2021/0210469 A1 Jul. 8, 2021

(30) Foreign Application Priority Data

Apr. 25, 2017 (JP) .............................. JP2017-086056

(51) Int. Cl.
*G09G 3/00* (2006.01)
*G09G 3/32* (2016.01)
(Continued)

(52) U.S. Cl.
CPC ................ *G09F 9/301* (2013.01); *G09F 9/33* (2013.01); *G09G 3/035* (2020.08); *G09F 19/227* (2021.05); *G09G 3/32* (2013.01); *G09G 2380/02* (2013.01)

(58) Field of Classification Search
None
See application file for complete search history.

(56) References Cited

U.S. PATENT DOCUMENTS

2005/0207156 A1  9/2005  Wang et al.
2006/0273304 A1* 12/2006  Cok ...................... H01L 51/524
                                                                    438/26
(Continued)

FOREIGN PATENT DOCUMENTS

CN         102252217      11/2011
DE    20 2015 007 026    12/2015
(Continued)

*Primary Examiner* — Matthew Yeung
(74) *Attorney, Agent, or Firm* — Clark & Brody LP

(57) ABSTRACT

An LED display is formed from a flexible transparent sheet substrate that is flexible and transparent; and a plurality of LED elements installed on one surface of the flexible transparent sheet substrate. In the LED display, the plurality of LED elements constitute a predetermined pattern of pixels on the flexible transparent sheet substrate, and using the LED elements, a predetermined moving image or still image is displayed on the one surface of the flexible transparent sheet substrate, and while the predetermined moving image or still image is being displayed on the one surface of the flexible transparent sheet substrate, form the one surface side of the flexible transparent sheet substrate, a landscape on the opposite side can be visually confirmed, and from the other surface side of the flexible transparent sheet substrate, a landscape on the opposite side can be visually confirmed.

6 Claims, 10 Drawing Sheets

(51) Int. Cl.
  *G09F 9/30*     (2006.01)
  *G09F 9/33*     (2006.01)
  *G09F 19/22*     (2006.01)

(56) References Cited

U.S. PATENT DOCUMENTS

| | | |
|---|---|---|
| 2008/0198584 A1 | 8/2008 | Fouraux et al. |
| 2012/0019434 A1* | 1/2012 | Kuhlman ............ G02F 1/13306 |
| | | 345/1.3 |
| 2013/0051000 A1 | 2/2013 | Yu et al. |
| 2015/0370130 A1* | 12/2015 | Lin ................... G02F 1/134309 |
| | | 349/69 |
| 2017/0199604 A1* | 7/2017 | Lin ....................... G06F 3/0416 |

FOREIGN PATENT DOCUMENTS

| | | |
|---|---|---|
| EP | 2 799 768 | 4/2014 |
| JP | 2002-014631 | 1/2002 |
| JP | 2008-052238 | 3/2008 |
| JP | 2013-516660 | 5/2013 |
| JP | 2014-202816 | 10/2014 |
| JP | 3203462 | 3/2016 |
| JP | 2017-045855 | 3/2017 |
| JP | 2017-072819 | 4/2017 |
| KR | 10-2008-0016414 | 2/2008 |
| KR | 10-2014-0087592 | 7/2014 |

\* cited by examiner

LED DISPLAY

TECHNICAL FIELD

The present invention relates to an LED display which displays predetermined moving images or still images.

BACKGROUND ART

An LED display device having an LED display having a plurality of LED elements corresponding to a plurality of pixels disposed in a predetermined pattern and displaying predetermined images, a plate-shaped or film-like optical member A having a function of holding a predetermined distance from each of the LED elements or disposed in close contact and diffusing light, and an optical member B having light transmittance and disposed between the LED element and the optical member A and in contact both with the LED element and the optical member A is disclosed (see Patent Literature 1). In this LED display device, since light of the LED element is changed from a point to a plane by disposing the plate-shaped or film-like optical member A diffusing the light by holding a certain distance from the LED element or in close contact therewith, a point light source is not recognized but can be recognized as a continuous natural image, and occurrence of a moire phenomenon in re-photographing can be prevented.

CITATION LIST

Patent Literature

[Patent Literature 1] Japanese Patent Laid-Open No. 2014-202816

SUMMARY OF THE INVENTION

Problem to be Solved by the Invention

The LED display device disclosed in the aforementioned Patent Literature 1 is placed on a floor or a base and displays a predetermined image in that state, but since a scene on an opposite side cannot be visually recognized from a side of one of surfaces of the LED display device and the scene on the opposite side cannot be visually recognized from the other surface side of the LED display device, a state on the one surface side or the other surface side of the LED display device cannot be known while the predetermined moving image or still image is being displayed or the predetermined moving image or still image is not displayed. Moreover, if an installation spot of the LED display device is curved with a predetermined radius of curvature or bent at a predetermined angle, the LED display device cannot be curved or bent in accordance with the radius of curvature or the angle, and the LED display device cannot be mounted at the installation spot curved with a predetermined radius of curvature or at the installation spot bent at the predetermined angle.

An object of the present invention is to provide an LED display capable of displaying a predetermined moving image or still image while being installed at an arbitrary place and of visual recognition of a scene (state) on the one surface side or the other surface side while the moving image or the still image is being displayed or the moving image or the still image is not displayed. Another object of the present invention is to provide an LED display which can be curved with a predetermined radius of curvature and can display the moving image or the still image in the curved state. Still another object of the present invention is to provide an LED display which can be installed at an arbitrary place and can be used as a transmission medium for transmitting various types of information of goods or services.

Solution to the Problem

A first feature of an LED display according to the present invention for solving the aforementioned problem is that the LED display is formed by a transparent flexible transparent sheet substrate of a predetermined area having flexibility and a plurality of LED elements installed on one of surfaces of the flexible transparent sheet substrate, the plurality of LED elements is disposed in a predetermined number per unit area of the flexible transparent sheet substrate so as to configure pixels of a predetermined pattern, a predetermined moving image or still image is displayed on one of the surfaces of the flexible transparent sheet substrate by using the plurality of LED elements, a scene on an opposite side can be visually recognized from the one surface side of the flexible transparent sheet substrate and the scene on the opposite side can be visually recognized from the other surface side of the flexible transparent sheet substrate during display of the predetermined moving image or still image on one of the surfaces of the flexible transparent sheet substrate.

As an example of the LED display having the aforementioned first feature, in the LED display including a transparent support plate with a predetermined area on which the other surface of the flexible transparent sheet substrate is mounted on one surface or both surfaces, the scene on the opposite side can be visually recognized from the one surface side of the support plate, and the scene on the opposite side can be visually recognized from the other surface side of the support plate during display of the predetermined moving image or still image on the one surface of the flexible transparent sheet substrate by using the plurality of LED elements.

A second feature of the LED display according to the present invention for solving the aforementioned problem is that the LED display is formed by a transparent flexible transparent sheet substrate of a predetermined area having flexibility and a plurality of LED elements installed on one of surfaces of the flexible transparent sheet substrate, the plurality of LED elements is disposed in a predetermined number per unit area of the flexible transparent sheet substrate so as to configure pixels of a predetermined pattern, a predetermined moving image or still image is displayed on one of the surfaces of the flexible transparent sheet substrate by using the plurality of LED elements, a scene on an opposite side cannot be visually recognized from the one surface side of the flexible transparent sheet substrate and the scene on the opposite side can be visually recognized from the other surface side of the flexible transparent sheet substrate during display of the predetermined moving image or still image on one of the surfaces of the flexible transparent sheet substrate.

As an example of the LED display having the aforementioned second feature, in the LED display including a transparent support plate with a predetermined area on which the other surface of the flexible transparent sheet substrate is mounted on one surface or both surfaces, during display of the predetermined moving image or still image on one of the surfaces of the flexible transparent sheet substrate by using the plurality of LED elements, the scene on the opposite side cannot be visually recognized from the side of the surface of the support plate displaying the moving image or the still image, and the scene on the opposite side can be visually recognized from the side of the surface of the support plate not displaying the moving image or still image.

As an example of the LED display having the first and second features, the support plate draws an arc having a predetermined radius of curvature so as to project toward at least one of front and rear thereof, and the flexible transparent sheet substrate is mounted on the support plate while drawing an arc in accordance with the curvature of the support plate.

A third feature of the LED display according to the present invention for solving the aforementioned problem is that the LED display is formed by a transparent flexible transparent sheet substrate of a predetermined area having flexibility and a plurality of LED elements installed on one of surfaces and the other surface of the flexible transparent sheet substrate, the plurality of LED elements is disposed in a predetermined number per unit area of the flexible transparent sheet substrate so as to configure pixels of a predetermined pattern, a predetermined moving image or still image is displayed on at least one surface of one of the surfaces and the other surface of the flexible transparent sheet substrate by using the plurality of LED elements, a scene on an opposite side can be visually recognized from the one surface side of the flexible transparent sheet substrate and the scene on the opposite side can be visually recognized from the other surface side of the flexible transparent sheet substrate during display of the predetermined moving image or still image on at least one surface of the one surface and the other surface of the flexible transparent sheet substrate.

As an example of the LED display having the third feature, in the LED display including a transparent first support plate having a predetermined area faced with the one surface of the flexible transparent sheet substrate and a transparent second support plate having a predetermined area faced with the other surface of the flexible transparent sheet substrate, during display of a predetermined moving image or still image on at least one surface of the one surface and the other surface of the flexible transparent sheet substrate by using the plurality of LED elements, a scene on the opposite side can be visually recognized from a side of an outer surface of the first support plate and a scene on the opposite side can be visually recognized from a side of an outer surface of the second support plate.

A fourth feature of the LED display according to the present invention for solving the aforementioned problem is that the LED display is formed by a transparent flexible transparent sheet substrate of a predetermined area having flexibility and a plurality of LED elements installed on one of surfaces and the other surface of the flexible transparent sheet substrate, the plurality of LED elements is disposed in a predetermined number per unit area of the flexible transparent sheet substrate so as to configure pixels of a predetermined pattern, a predetermined moving image or still image is displayed on at least one surface of the one of the surfaces and the other surface of the flexible transparent sheet substrate by using the plurality of LED elements, and during display of the predetermined moving image or still image on at least one surface of the one surface and the other surface of the flexible transparent sheet substrate, a scene on an opposite side cannot be visually recognized from a side of a surface of the flexible transparent sheet substrate displaying the moving image or still image, and the scene on the opposite side can be visually recognized from the side of the surface of the flexible transparent sheet substrate not displaying the moving image or still image.

As an example of the LED display having the fourth feature, in the LED display including a transparent first support plate having a predetermined area faced with the one surface of the flexible transparent sheet substrate and a transparent second support plate having a predetermined area faced with the other surface of the flexible transparent sheet substrate, during display of a predetermined moving image or still image on at least one surface of the one of surface and the other surface of the flexible transparent sheet substrate by using the plurality of LED elements, a scene on the opposite side cannot be visually recognized from a side of a surface of the support plate displaying the moving image or still image in the first and second support plates and a scene on the opposite side can be visually recognized from a side of the surface of the support plate not displaying the moving image or still image in the first and second support plates.

As an example of the LED display having the third and fourth features, the first support plate and the second support plate draw an arc having a predetermined radius of curvature so as to project toward at least one of front and rear thereof, and the flexible transparent sheet substrate is mounted between those support plates while drawing an arc in accordance with a curvature of the first support plate and the second support plate.

Advantageous Effect of the Invention

According to an LED display described in claim 1, the LED display is formed by the transparent flexible transparent sheet substrate of a predetermined area having flexibility and a plurality of LED elements installed on one of surfaces of the flexible transparent sheet substrate and configuring pixels of a predetermined pattern, and since a scene on an opposite side can be visually recognized from a side of one of surfaces of the flexible transparent sheet substrate and the scene on the opposite side can be visually recognized from the other surface side of the flexible transparent sheet substrate during display of a predetermined moving image or still image, not only that the LED display can be installed at an arbitrary place and display the predetermined moving image or still image on the one surface of the flexible transparent sheet substrate but also, during display of the predetermined moving image or still image, the scene on the opposite side can be seen from the side of the one surface and the side of the other surface of the flexible transparent sheet substrate, a closed feeling is not given, and the predetermined moving image or still image can be shown in an open environment by using the LED display. The LED display can be used as an advertisement medium which can be installed at an arbitrary place and can be used as a transmission medium for transmitting various types of information on goods and services by displaying a predetermined image on the one surface of the flexible transparent sheet substrate.

The LED display includes the transparent support plate having a predetermined area and the other surface of the flexible transparent sheet substrate mounted on one surface or both surfaces, and during display of a predetermined moving image or still image on the one surface of the flexible transparent sheet substrate by using the plurality of LED elements, the scene on the opposite side can be visually recognized from the side of the one surface of the support plate, and the scene on the opposite side can be visually recognized from the side of the other surface of the support plate, and not only that the LED display can be installed at an arbitrary place and display the predetermined moving image or still image on the one surface or the both surfaces of the support plate but also, during the display of the predetermined moving image or still image, the scene on the opposite side can be visually recognized from the side of the one surface of the support plate, the scene on the opposite side can be visually recognized from the side of the other surface of the support plate, the closed feeling is not given, and the predetermined moving image or still image can be shown in the open environment by using an image display panel. The LED display can be used as a panel plate for advertisement such as a poster panel, an exhibition panel, a partition panel and the like which can be installed at an arbitrary place and can be used as a transmission medium for transmitting various types of information on goods and services by displaying a predetermined image on the both surfaces or the one surface of the support plate.

According to an LED display described in claim 3, the LED display is formed by the transparent flexible transparent sheet substrate of a predetermined area having flexibility and a plurality of LED elements installed on one of surfaces of the flexible transparent sheet substrate and configuring pixels of a predetermined pattern, and since a scene on the opposite side cannot be visually recognized from the side of the one surface of the flexible transparent sheet substrate and the scene on the opposite side can be visually recognized from the side of the other surface of the flexible transparent sheet substrate during display of a predetermined moving image or still image, not only that the LED display can be installed at an arbitrary place and can display the predetermined moving image or still image on the one surface but also, during the display of the predetermined moving image or still image, the scene on the opposite side can be visually recognized from the side of the other surface of the flexible transparent sheet substrate, and the state on the opposite side can be known form the side of the other surface of the flexible transparent sheet substrate, a state on the side of the other surface of the flexible transparent sheet substrate can be hidden by making the scene on the opposite side visually unrecognizable from the one surface, and the side of the other surface of the flexible transparent sheet substrate can be used as a private space or a secret space. The LED display can be used as an advertisement medium which can be installed at an arbitrary place and can be used as a transmission medium for transmitting various types of information on goods and services by displaying the predetermined image on the one surface of the flexible transparent sheet substrate.

In the LED display including the transparent support plate having a predetermined area and the other surface of the flexible transparent sheet substrate mounted on one surface or both surfaces, and during display of a predetermined moving image or still image on the one surface of the flexible transparent sheet substrate by using the plurality of LED elements, the scene on the opposite side cannot be visually recognized from the side of the surface of the support plate displaying the moving image or still image, and the scene on the opposite side can be visually recognized from the side of the surface of the support plate not displaying the moving image or still image, not only that the LED display can be installed at an arbitrary place and can display the predetermined moving image or still image on the one surface or the both surfaces of the support plate but also, during display of the predetermined moving image or still image, the scene on the opposite side can be visually recognized from the surface side of the support plate not displaying the moving image or still image, the state on the opposite side can be known from the side of the surface of the support plate not displaying the moving image or still image, the state on the surface side of the support plate not displaying the moving image or still image can be hidden by making the scene on the opposite side visually unrecognizable from the side of the surface of the support plate displaying the moving image or still image, and the surface side of the support plate not displaying the moving image or still image can be used as a private space or a secret space. The LED display can be used as a panel plate for advertisement such as a poster panel, an exhibition panel, a partition panel and the like which can be installed at an arbitrary place and can be used as a transmission medium for transmitting various types of information on goods and services by displaying a predetermined image on the both surfaces or the one surface of the support plate.

In the LED display in which the support plate draws an arc having a predetermined radius of curvature so as to project toward at least one of front and rear thereof, and the flexible transparent sheet substrate is mounted on the support plates while drawing an arc in accordance with the curvature of the support plate, even if the support plate is curved with the predetermined radius of curvature, the flexible transparent sheet substrate having flexibility can be curved in accordance with the radius of curvature and thus, the flexible transparent sheet substrate can be mounted on the support plate curved with the predetermined radius of curvature, whereby the LED displays with various curve shapes can be made, and the predetermined moving image or still image can be displayed on the one surface or the both surfaces in the support plate curved in various ways. The LED display can be used as a panel plate for advertisement such as a poster panel, an exhibition panel, a partition panel and the like which can be installed at an arbitrary place and are curved with the predetermined radius of curvature and can be used as a transmission medium for transmitting various types of information on goods and services by displaying the predetermined image on the both surfaces or the one surface of the support plate curved with the predetermined radius of curvature.

According to the LED display described in claim 6, the LED display is formed by the transparent flexible transparent sheet substrate of a predetermined area having flexibility and a plurality of LED elements installed on one of surfaces and the other surface of the flexible transparent sheet substrate and configuring pixels of a predetermined pattern, and since a scene on the opposite side can be visually recognized from the side of the one surface of the flexible transparent sheet substrate and the scene on the opposite side can be visually recognized from the side of the other surface of the flexible transparent sheet substrate during display of a predetermined moving image or still image on at least one surface of the one surface and the other surface of the flexible transparent sheet substrate, not only that the LED display can be installed at an arbitrary place and can display the predetermined moving image or still image on the one surface or the other surface of the flexible transparent sheet substrate but also, during the display of the predetermined moving image or still image the scene on the opposite side can be seen from the side of the one surface and the side of the other surface of the flexible transparent sheet substrate, the closed feeling is not given, and the predetermined moving image or still image can be shown in the open environment by using the LED display. The LED display can be used as an advertisement medium which can be installed at an arbitrary place and can be used as a transmission medium for transmitting various types of information on the goods and services by displaying the predetermined image on at least one surface in the one surface and the other surface of the flexible transparent sheet substrate.

In the LED display including the transparent first support plate having a predetermined area faced with the one of the surfaces of the flexible transparent sheet substrate and the transparent second support plate having a predetermined area faced with the other surface of the flexible transparent sheet substrate, and during display of a predetermined moving image or still image on at least one surface of the one surface and the other surface of the flexible transparent sheet substrate by using the plurality of LED elements, a scene on the opposite side can be visually recognized from a side of an outer surface of the first support plate and a scene on the opposite side can be visually recognized from a side of an outer surface of the second support plate, not only that the LED display can be installed at an arbitrary place and can display the predetermined moving image or still image on the outer surface of the first support plate or the second support plate but also, during display of the predetermined moving image or still image, the scene on the opposite side can be visually recognized from the side of the outer surface of the first support plate and the scene on the opposite side can be visually recognized from the side of the outer surface of the second support plate, the closed feeling is not given, and the predetermined moving image or still image can be shown in the open environment by using the image display panel. The LED display can be used as a panel plate for advertisement such as a poster panel, an exhibition panel, a partition panel and the like which can be installed at an arbitrary place and can be used as a transmission medium for transmitting various types of information on goods and services by displaying a predetermined image on the outer surface of the first support plate or the outer surface of the second support plate.

According to the LED display described in claim 8, the LED display is formed by the transparent flexible transparent sheet substrate of a predetermined area having flexibility and a plurality of LED elements installed on the one of surfaces and the other surface of the flexible transparent sheet substrate and configuring pixels of a predetermined pattern, and during display of the predetermined moving image or still image on at least one surface of the one surface and the other surface of the flexible transparent sheet substrate, since a scene on the opposite side cannot be visually recognized from the side of the surface of the flexible transparent sheet substrate displaying the moving image or still image and the scene on the opposite side can be visually recognized from the side of the surface of the flexible transparent sheet substrate not displaying the moving image or still image, not only that the LED display can be installed at an arbitrary place and can display the predetermined moving image or still image on the one surface or the other surface but also, during the display of the predetermined moving image or still image, the scene on the opposite side can be visually recognized from the side of surface of the flexible transparent sheet substrate not displaying the moving image or still image and the state on the other side can be known from the side of the surface of the flexible transparent sheet substrate not displaying the moving image or still image, and the state on the side of the surface of the flexible transparent sheet substrate not displaying the moving image or still image can be hidden by making the scene on the opposite side visually unrecognizable from the side of the surface of the flexible transparent sheet substrate displaying the moving image or still image, and the side on the surface of the flexible transparent sheet substrate not displaying the moving image or still image can be used as a private space or a secret space. The LED display can be used as an advertisement medium which can be installed at an arbitrary place and can be used as a transmission medium for transmitting various types of information on the goods and services by displaying the predetermined image on at least one surface in the one surface and the other surface of the flexible transparent sheet substrate.

The LED display includes the transparent first support plate having a predetermined area faced with one of the surfaces of the flexible transparent sheet substrate and the transparent second support plate having a predetermined area faced with the other surface of the flexible transparent sheet substrate, and during display of a predetermined moving image or still image on at least one surface of the one surface and the other surface of the flexible transparent sheet substrate by using the plurality of LED elements, a scene on the opposite side cannot be visually recognized from the side of the surface of the support plate displaying the moving image or still image in the first and second support plates, and a scene on the opposite side can be visually recognized from the side of the surface of the support plate not displaying the moving image or still image in the first and second support plates, and not only that the LED display can be installed at an arbitrary place and can display the predetermined moving image or still image on the outer surface of the first support plate or the second support plate but also, during display of the predetermined moving image or still image, the scene on the opposite side can be visually recognized from the side of the surface of the support plate not displaying the moving image or still image and a state on the other side can be known from the side of the surface of the support plate not displaying the moving image or still image, and the state on the side of the surface of the support plate not displaying the moving image or still image can be hidden by making the scene on the opposite side visually unrecognizable from the side of the surface of the support plate displaying the moving image or still image, and the side on the surface of the support plate not displaying the moving image or still image can be used as a private space or a secret space. The LED display can be used as a panel plate for advertisement such as a poster panel, an exhibition panel, a partition panel and the like which can be installed at an arbitrary place and can be used as a transmission medium for transmitting various types of information on goods and services by displaying a predetermined image on the outer surface of the first support plate or the outer surface of the second support plate.

With regard to the LED display in which the first support plate and the second support plate draw an arc having a predetermined radius of curvature so as to project toward at least one of front and rear thereof, and the flexible transparent sheet substrate is disposed between those support plates while drawing an arc in accordance with the curvature of the first support plate and the second support plate, even if the first and second support plates are curved with the predetermined radius of curvature, the flexible transparent sheet substrate having flexibility can be curved in accordance with the radius of curvature and thus, the flexible transparent sheet substrate can be disposed between the first and second support plates curved with the predetermined radius of curvature, whereby the LED displays with various curve shapes can be made, and the predetermined moving image or still image can be displayed on the outer surfaces in the first support plate and the second support plate curved in various ways. The LED display can be used as a panel plate for advertisement such as a poster panel, an exhibition panel, a partition panel and the like which can be installed at an arbitrary place and are curved with the predetermined radius of curvature and can be used as a transmission medium for transmitting various types of information on goods and services by displaying the predetermined image on the outer surface of the first support plate and the outer surface of the second support plate curved with the predetermined radius of curvature.

DESCRIPTION OF EMBODIMENT

Figure 1:
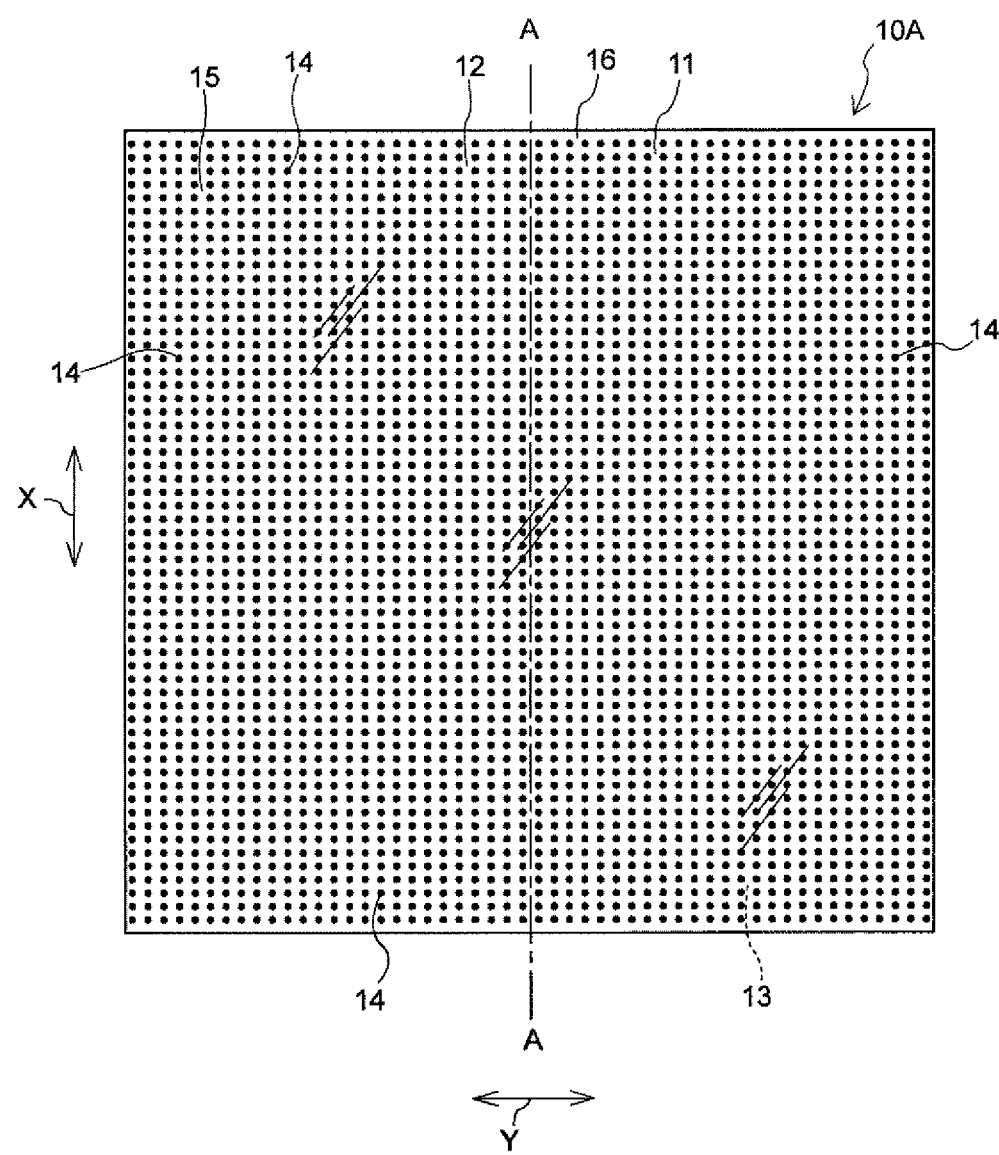
FIG. 1 is a perspective view of an LED display illustrated as an example.
Figure 2:
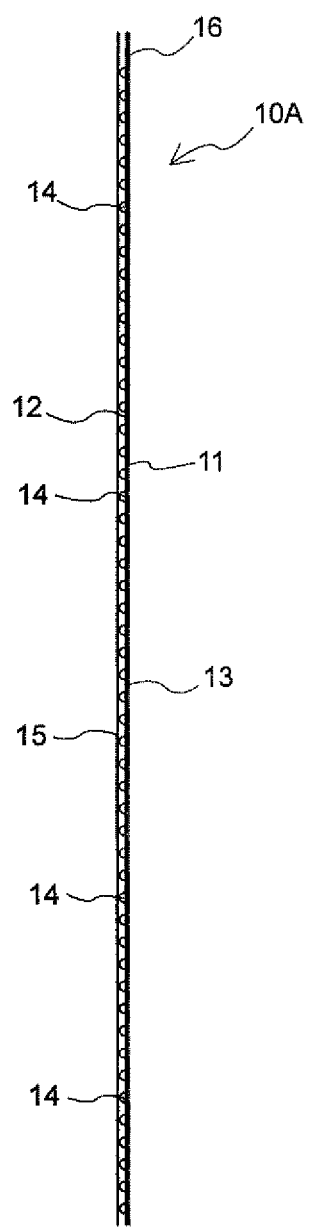
FIG. 2 is an A-A line end surface diagram of FIG. 1.

Details of an LED display according to the present invention will be described by referring to the attached drawings such as FIG. 1 which is a perspective view of an LED display 10A illustrated as an example as follows. FIG. 2 is an A-A line end surface view of FIG. 1. In FIG. 1, a vertical direction is indicated by an arrow X, and a lateral direction is indicated by an arrow Y. The LED display 10A illustrated in FIG. 1 is formed by a transparent (colorless and transparent or colored and transparent, preferably colorless and transparent) flexible transparent sheet substrate 11 of a predetermined area, a plurality of LED elements 14 (LED chips) disposed on one surface 12 of the flexible transparent sheet substrate 11, a transparent (colorless and transparent or colored and transparent, preferably colorless and transparent) ultraviolet-ray shielding protective film 15, and an electronic control module (not shown) installed on an end portion 16 of the flexible transparent sheet substrate 11.

The flexible transparent sheet substrate 11 is a transparent sheet (plastic sheet) of a predetermined area having flexibility and made of a synthetic resin (thermoplastic synthetic resin) and has one surface 12 and the other surface 13. The flexible transparent sheet substrate 11 can be curved into an arc shape with a predetermined radius of curvature and can be bent (folded) at a predetermined angle. Therefore, the LED display 10A has flexibility, can be curved into an arc shape with a predetermined radius of curvature and can be bent (folded) at a predetermined angle. The flexible transparent sheet substrate 11 has its thickness dimension within a range from 0.2 to 1.5 mm. The flexible transparent sheet substrate 11 has its planar shape molded into a square but can be molded not only to a square but also into any shape such as a diamond, a circle, an oval and the like.

Those LED elements 14 are orderly aligned by being separated at an equal interval in the vertical direction on the one surface 12 of the flexible transparent sheet substrate 11 and are orderly aligned by being separated at an equal interval in the lateral direction. Those LED elements 14 are installed/fixed on the one surface 12 of the flexible transparent sheet substrate 11 in the aligned state vertically and laterally. Those LED elements 14 are electrically connected to each other and are electrically connected to an electronic control module. Those LED elements emit light in three primary colors (R, G, B).

Those LED elements 14 have super-high brightness of 6000 to 10000 mcd and have a wide angle of beam spread. The number of LED elements 14 disposed per unit area (10 mm×10 mm) of the flexible transparent sheet substrate 11 is 1 to 6. Those LED elements 14 are divided into blocks by the predetermined number (by a predetermined area of the flexible transparent sheet substrate 11) and form first to n-th blocks. Those LED elements 14 are disposed on the one surface 12 of the flexible transparent sheet substrate 11 and constitute pixels of a predetermined pattern.

The ultraviolet-ray shielding protective film 15 is a transparent film (plastic film) having flexibility and made of a synthetic resin (thermoplastic synthetic resin) and is molded to substantially the same shape and size of the flexible transparent sheet substrate 11. The ultraviolet-ray shielding protective film 15 is disposed on the one surface 12 of the flexible transparent sheet substrate 11 and is bonded to the one surface 12 of the flexible transparent sheet substrate 11 by predetermined bonding means (an adhesive, an adhesive tape, sewing and the like) (not shown). The ultraviolet-ray shielding protective film 15 jackets (covers) those LED elements 14 disposed on the one surface 12 of the flexible transparent sheet substrate 11. The ultraviolet-ray shielding protective film 15 shields the ultraviolet ray and prevents the ultraviolet ray to reach those LED elements 14, prevents contact between those LED elements 14 and external objects, and protects those LED elements 14 from damage.

The electronic control module is connected to a controller (not shown), and collectively controls those LED elements 14 for each of the first to n-th blocks. The electronic control module adjusts luminescent colors of those LED elements 14 and changes brightness of the luminescent colors for each of the first to n-th blocks in a time series. In the LED display 10A, since those LED elements 14 emitting the light in the three primary colors (R, G, B) are mounted on the flexible transparent sheet substrate 11, those LED elements 14 can display (emit light of) a plurality of various colors (visible colors), and a plurality of various full-color moving images (including black and white) or a plurality of various full-color still images (including black and white) can be displayed continuously or intermittently.

The controller is a computer having a central processing unit (CPU or MPU) and a memory (main memory and cache memory) and operated by an independent operating system (OS) and incorporates a large-capacity storage region (large-capacity hard disk and the like). To the controller, a plurality of various video equipment such as a TV receiver, a video monitor, a tuner, a video camera, a video recorder, an optical media and the like are connected. The controller modifies a plurality of various images transmitted from the video equipment and creates an image (moving image or still image) to be displayed on the LED display 10A and transmits the created image to the electronic control module of the LED display 10A.

In the LED display 10A, the image (full-color moving image or full-color still image) created by the controller is transmitted from the controller to the electronic control module, and the electronic control module adjusts brightness of those LED elements 14 while adjusting the luminescent colors of those LED elements 14 and displays the predetermined image (full-color moving image or full-color still image) on the one surface 12 of the flexible transparent sheet substrate 11.

The LED display 10A can be used as an advertisement medium which can be installed at an arbitrary place and can be used as a transmission medium for transmitting various types of information on goods and services by being installed on a transparent window pane having a perpendicular surface or a curved surface, a transparent poster panel having a perpendicular surface or a curved surface, a transparent exhibition panel having a perpendicular surface or a curved surface, and a transparent partition panel having a perpendicular surface or a curved surface and by displaying the predetermined image on the one surface 12 of the flexible transparent sheet substrate 11.

In the LED display 10A, since the flexible transparent sheet substrate 11 is transparent, a scene (sight) on an opposite side can be visually recognized from the side of the one surface 12 of the flexible transparent sheet substrate 11 (LED display 10A), and the scene (sight) on the opposite side can be visually recognized from the side of the other surface 13 of the flexible transparent sheet substrate 11 (LED display 10A) during display of a predetermined moving image or still image on the one surface 12 of the flexible transparent sheet substrate 11 by using the plurality of LED elements 14.

When the scene (sight) on the opposite side can be visually recognized from the side of the one surface 12 and the side of the other surface 13 of the flexible transparent sheet substrate 11 (LED display 10A) during display of a predetermined moving image or still image, not only that the LED display 10A can be installed at an arbitrary place and can display the predetermined moving image or still image on the one surface 12 of the flexible transparent sheet substrate 11 but also that the scene on the opposite side can be seen from the side of the one surface 12 and the side of the other surface 13 of the flexible transparent sheet substrate 11 during display of the predetermined moving image or still image, a closed feeling is not given, and the predetermined moving image or still image can be shown in an open environment by using the LED display 10A.

In the LED display 10A, the scene on the opposite side can be visually recognized from the side of the other surface 13 of the flexible transparent sheet substrate 11 during display of the predetermined moving image or still image on the one surface 12 of the flexible transparent sheet substrate 11 by using those LED elements 14 by increasing density of the luminance colors (colors) of those LED elements 14 and by increasing brightness of those LED elements 14, but the scene on the opposite side can be made visually unrecognizable from the side of the one surface 12 of the flexible transparent sheet substrate 11.

When the scene on the opposite side can be visually recognized from the side of the other surface 13 of the flexible transparent sheet substrate 11, and the scene on the opposite side cannot be visually recognized from the side of the one surface 12 of the flexible transparent sheet substrate 11 during display of the predetermined moving image or still image by using those LED elements 14, not only that the LED display 10A can be installed at an arbitrary place and can display the predetermined moving image or still image on the one surface 12 of the flexible transparent sheet substrate 11 but also, during display of the predetermined moving image or still image, that the scene on the opposite side can be visually recognized from the side of the other surface 13 of the flexible transparent sheet substrate 11 and the state on the opposite side can be known from the side of the other surface 13 of the flexible transparent sheet substrate 11, and the state on the side of the other surface 13 of the flexible transparent sheet substrate 11 can be hidden by making the scene on the opposite side visually unrecognizable from the one surface 12 of the flexible transparent sheet substrate 11, and the side of the other surface 13 of the flexible transparent sheet substrate 11 can be used as a private space or a secret space.

Figure 3:
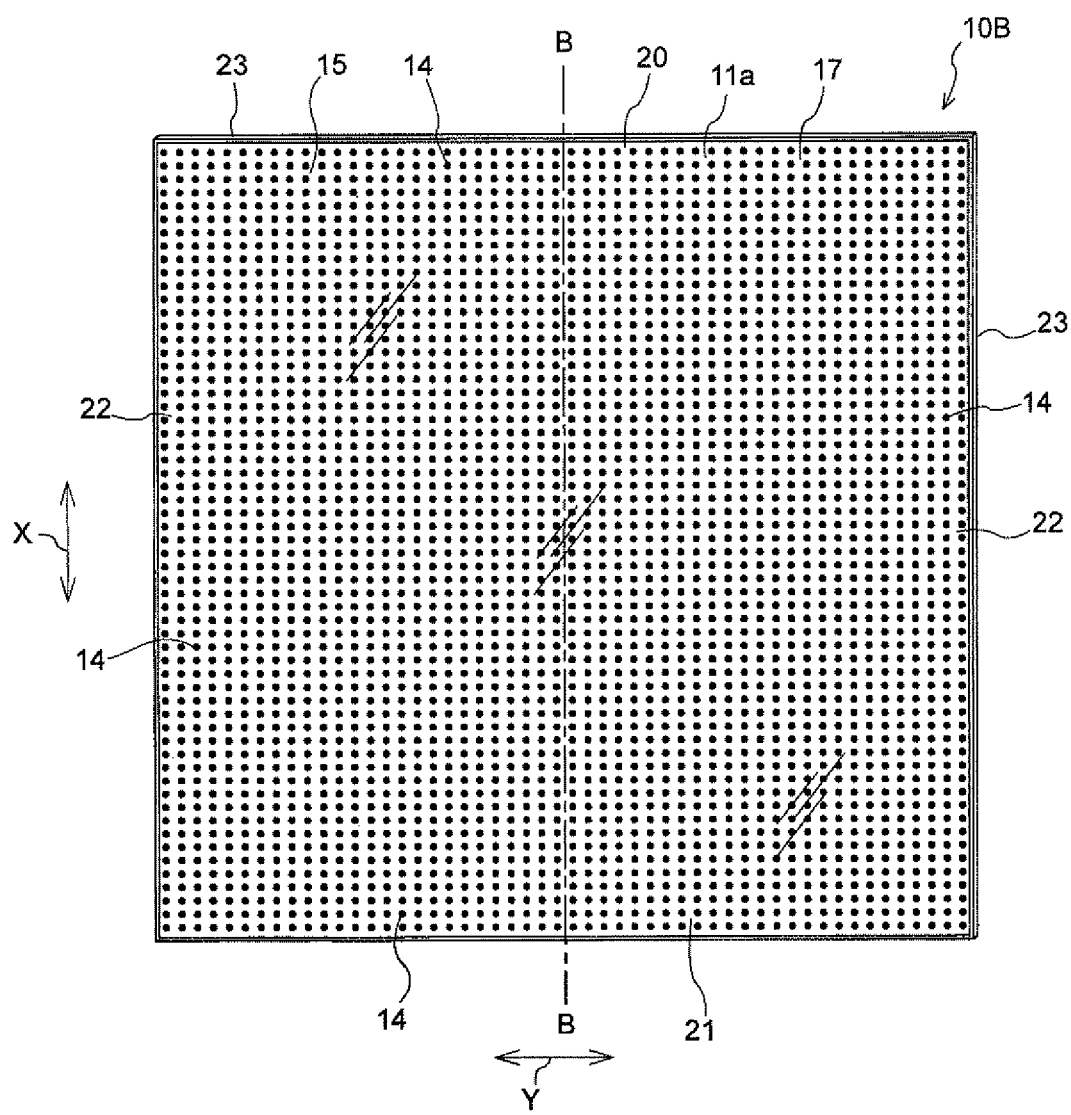
FIG. 3 is a perspective view of the LED display illustrated as another example.
Figure 4:
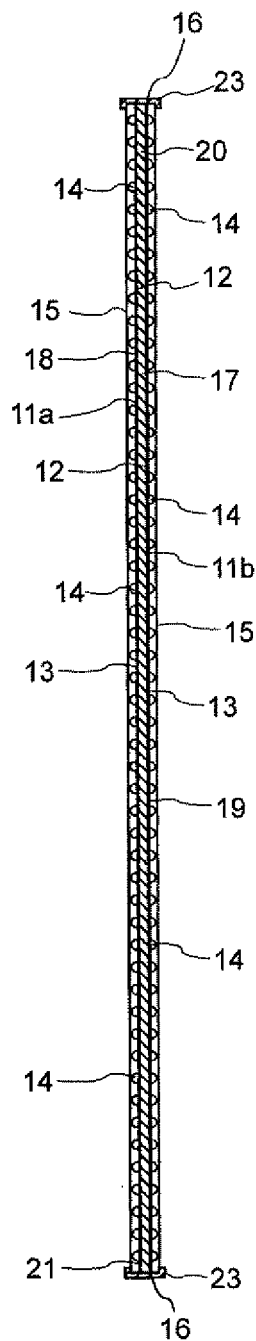
FIG. 4 is a B-B line end surface diagram of FIG. 3.

FIG. 3 is a perspective view of an LED display 10B illustrated as another example, and FIG. 4 is a B-B line end surface view of FIG. 3. In FIG. 3, the vertical direction is indicated by the arrow X, and the lateral direction is indicated by the arrow Y. The LED display 10B illustrated in FIG. 3 is formed by two transparent (colorless and transparent or colored and transparent, preferably colorless and transparent) flexible transparent sheet substrates 11a and 11b, a plurality of LED elements 14 (LED chips) disposed on one surface 12 of those flexible transparent sheet substrates 11a and 11b, the transparent (colorless and transparent or colored and transparent, preferably colorless and transparent) ultraviolet-ray shielding protective film 15, an electronic control module (not shown) installed on an end portion 16 of the flexible transparent sheet substrates 11a and 11b, and a transparent (colorless and transparent or colored and transparent, preferably colorless and transparent) support plate 17 of a predetermined area.

Those flexible transparent sheet substrates 11a and 11b are transparent sheets (plastic sheets) of a predetermined area having flexibility and made of a synthetic resin (thermoplastic synthetic resin) and have one surface 12 and the other surface 13. The flexible transparent sheet substrates 11a and 11b can be curved into an arc shape with a predetermined radius of curvature and can be bent (folded) at a predetermined angle. Those flexible transparent sheet substrates 11a and 11b have the thickness dimension within a range from 0.2 to 1.5 mm.

Those LED elements 14 are orderly aligned by being separated at an equal interval in the vertical direction on the one surface 12 of those flexible transparent sheet substrates 11a and 11b and are orderly aligned by being separated at an equal interval in the lateral direction. Those LED elements 14 are installed/fixed on the one surface 12 of those flexible transparent sheet substrates 11a and 11b in the aligned state vertically and laterally. Those LED elements 14 are electrically connected to each other and are electrically connected to an electronic control module.

Those LED elements 14 have super-high brightness of 6000 to 10000 mcd and have a wide angle of beam spread. The number of LED elements 14 disposed per unit area (10 mm×10 mm) of the flexible transparent sheet substrates 11a and 11b is 1 to 6. Those LED elements 14 are divided into blocks by the predetermined number (by a predetermined area of the flexible transparent sheet substrates 11a and 11b) and form first to n-th blocks. Those LED elements 14 are disposed on the one surface 12 of the flexible transparent sheet substrates 11a and 11b and constitute pixels of a predetermined pattern.

The ultraviolet-ray shielding protective film 15 is molded to substantially the same shape and size of the flexible transparent sheet substrates 11a and 11b and is mounted on the one surface 12 of those flexible transparent sheet substrates 11a and 11b. The ultraviolet-ray shielding protective film 15 is the same as that of FIG. 1, jackets (covers) those LED elements 14 disposed on the one surface 12 of the flexible transparent sheet substrates 11a and 11b, prevents the ultraviolet ray to reach those LED elements 14, prevents contact between those LED elements 14 and external objects, and protects those LED elements 14 from damage. The electronic control module is the same as that of FIG. 1 and is connected to the controller (not shown). The controller is the same as that of FIG. 1.

The support plate 17 has a flat one surface 18 and a flat other surface 19 and extends linearly in the lateral direction and the vertical direction. The support plate is a plastic plate made of a synthetic resin (thermoplastic synthetic resin), and a transparent acrylic plate is used. Other than the acrylic plate, a transparent vinyl chloride plate, a transparent polycarbonate plate, and a transparent PET plate can be also used for the support plate 17. The support plate 17 has its thickness dimension within a range from 5 to 10 mm. On upper and lower end portions 20 and 21 and both side edge portions 22 (peripheral edge portions) of the support plate 17, a frame 23 surrounding those edge portions 20 to 22 is installed/fixed.

The one flexible transparent sheet substrate 11*a* is disposed on the one surface 18 of the support plate 17. In the one flexible transparent sheet substrate 11*a*, the other surface 13 is mounted on the one surface 18 of the support plate 17 by predetermined bonding means (an adhesive or an adhesive tape) (not shown). The end portion on which the electronic control module of the one flexible transparent sheet substrate 11*a* is mounted is bent on the upper end portion 20 of the support plate 17 and is located on an upper end surface of the support plate 17.

The other flexible transparent sheet substrate 11*b* is disposed on the other surface 19 of the support plate 17. In the other flexible transparent sheet substrate 11*b*, the other surface 13 is mounted on the other surface 19 of the support plate 17 by predetermined bonding means (an adhesive or an adhesive tape) (not shown). The end portion 16 on which the electronic control module of the other flexible transparent sheet substrate 11*b* is mounted is bent on the lower end portion 21 of the support plate 17 and is located on a lower end surface of the support plate 17. The flexible transparent sheet substrate may be mounted only on either one (one surface) of the one surface 18 and the other surface 19 of the support plate 17.

In the LED display 10B, the image (full-color moving image or full-color still image) created by the controller is transmitted from the controller to the electronic control module, and the electronic control module adjusts the brightness of those LED elements 14 while adjusting the luminescent colors of those LED elements 14 and displays the predetermined image (full-color moving image or full-color still image) on the one surface 12 of those flexible transparent sheet substrates 11*a* and 11*b*. In the LED display 10B, the image can be displayed on both surfaces (the one surface 18 and the other surface 19) of the support plate 17 and moreover, the image can be also displayed only on one surface (either one surface of the one surface 18 and the other surface 19) of the support plate 17.

The LED display 10B can be used as a panel plate for advertisement such as a poster panel, an exhibition panel, a partition panel and the like which can be installed at an arbitrary place and can be used as a transmission medium for transmitting various types of information on goods and services by displaying the predetermined image on at least either one (one surface or both surfaces) of the one surface 18 and the other surface 19 of the support plate 17.

In the LED display 10B, since those flexible transparent sheet substrates 11*a* and 11*b* and the support plate 17 are transparent, during display of the predetermined moving image or still image on the one surface 12 of at least either one of the substrates 11*a* and 11*b* in the flexible transparent sheet substrates 11*a* and 11*b* by using the plurality of LED elements 14, the scene (sight) on the opposite side (side of the other surface 19 of the support plate 17) can be visually recognized from the side of the one surface 18 of the support plate 17 (LED display 10B), and the scene (sight) on the opposite side (side of the one surface 18 of the support plate 17) can be visually recognized from the side of the other surface 19 of the support plate 17 (LED display 10B).

When the scene (sight) on the opposite side can be visually recognized from the side of the one surface 18 and the side of the other surface 19 of the support plate 17 (LED display 10B) during display of the predetermined moving image or still image, not only that the LED display 10B can be installed at an arbitrary place and can display the predetermined moving image or still image on the one surface or the both surfaces of the support plate 17 but also that the scene on the opposite side can be visually recognized from the side of the one surface 18 of the support plate 17, the scene on the opposite side can be visually recognized from the side of the other surface 19 of the support plate 17, the closed feeling is not given, and the predetermined moving image or still image can be shown in the open environment by using the LED display 10B.

In the LED display 10B, the scene on the opposite side can be visually recognized from the side of the surface of the support plate 17 not displaying the moving image or still image during display of the predetermined moving image or still image on the one surface 12 of the flexible transparent sheet substrates 11*a* and 11*b* by increasing density of the luminance colors (colors) of those LED elements 14 and by increasing brightness of those LED elements 14, by using the LED elements 14, but the scene on the opposite side can be made visually unrecognizable from the side of the surface of the support plate 17 displaying the moving image or still image.

When the scene on the opposite side cannot be visually recognized from the side of the surface of the support plate 17 displaying the moving image or still image and the scene on the opposite side can be visually recognized from the side of the surface of the support plate 17 not displaying the moving image or still image during display of the predetermined moving image or still image on the one surface 12 of the flexible transparent sheet substrates 11*a* and 11*b* by using those LED elements 14, not only that the LED display 10B can be installed at an arbitrary place and can display the predetermined moving image or still image on the one surface or the both surfaces of the support plate 17 but also that, during display of the predetermined moving image or still image, the scene on the opposite side can be visually recognized from the side of the surface of the support plate 17 not displaying the moving image or still image, the state on the opposite side can be known from the side of the surface of the support plate 17 not displaying the moving image or still image, the state on the side of the surface of the support plate 17 not displaying the moving image or still image can be hidden by making the scene on the opposite side visually unrecognizable from the side of the surface of the support plate 17 displaying the moving image or still image, and the side of the surface of the support plate 17 not displaying the moving image or still image can be used as a private space or a secret space.

Figure 5:
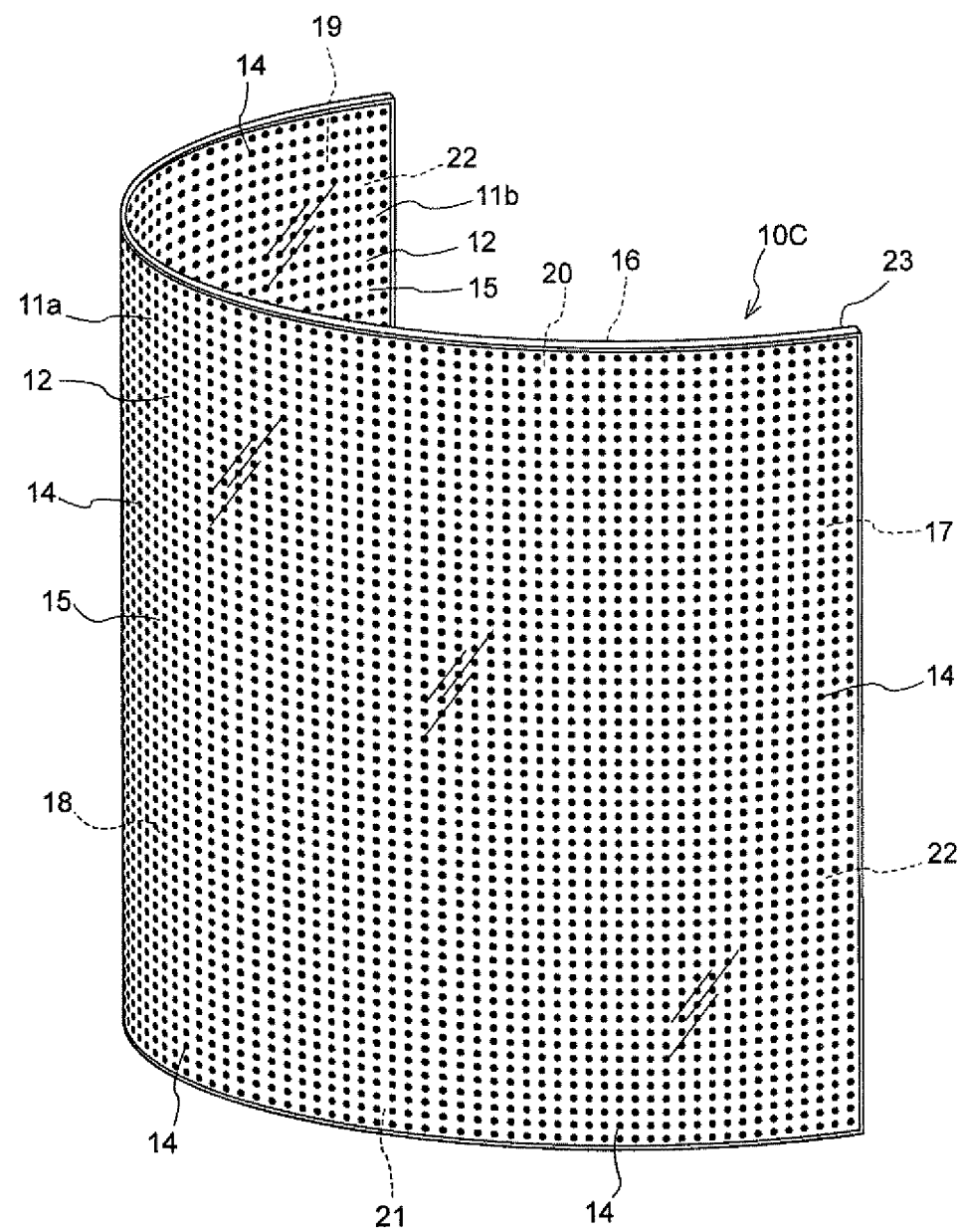
FIG. 5 is a perspective view of the LED display illustrated as another example.

FIG. 5 is a perspective view of an LED display 10C illustrated as another example. The LED display 10C illustrated in FIG. 5 is formed by two transparent (colorless and transparent or colored and transparent, preferably colorless and transparent) flexible transparent sheet substrates 11*a* and 11*b*, a plurality of LED elements 14 (LED chips) disposed on one surface 12 of those flexible transparent sheet substrates 11a and 11b, the transparent (colorless and transparent or colored and transparent, preferably colorless and transparent) ultraviolet-ray shielding protective film 15, an electronic control module (not shown) installed on the end portion 16 of the flexible transparent sheet substrates 11a and 11b, and the transparent (colorless and transparent or colored and transparent, preferably colorless and transparent) support plate 17 of a predetermined area.

Those flexible transparent sheet substrates 11a and 11b and those LED elements 14 are the same as those in FIGS. 1 and 3. The ultraviolet-ray shielding protective film 15 is molded to substantially the same shape and size of the flexible transparent sheet substrates 11a and 11b and is mounted on the one surface 12 of the flexible transparent sheet substrates 11a and 11b. The ultraviolet-ray shielding protective film 15 is the same as that of FIG. 1, jackets (covers) those LED elements 14 disposed on the one surface 12 of those flexible transparent sheet substrates 11a and 11b, prevents the ultraviolet ray to reach those LED elements 14, prevents contact between those LED elements 14 and external objects, and protects those LED elements 14 from damage. The electronic control module is the same as that of FIG. 1 and is connected to the controller (not shown). The controller is the same as that of FIG. 1.

The support plate 17 has the one surface 18 curved with a predetermined radius of curvature and the other surface 19 curved with a predetermined radius of curvature and draws an arc having a predetermined radius of curvature so as to project toward the front thereof. The support plate 17 is a plastic plate made of a synthetic resin (thermoplastic synthetic resin), and a transparent acrylic plate is used. Other than the acrylic plate, a transparent vinyl chloride plate, a transparent polycarbonate plate, and a transparent PET plate can be also used for the support plate 17. The support plate 17 has its thickness dimension within a range from 5 to 10 mm. On the upper and lower end portions 20 and 21 and the both side edge portions 22 (peripheral edge portions) of the support plate 17, the frame 23 surrounding those edge portions 20 to 22 is installed/fixed.

The one flexible transparent sheet substrate 11a is disposed on the one surface 18 of the support plate 17. The one flexible transparent sheet substrate 11a draws an arc with a predetermined radius of curvature so as to project toward the front in accordance with the curvature of the one surface 18 of the support plate 17, and the other surface 13 is mounted on the one surface 18 of the support plate 17 by predetermined bonding means (an adhesive or an adhesive tape) (not shown). The end portion on which the electronic control module of the one flexible transparent sheet substrate 11a is mounted is bent on the upper end portion 20 of the support plate 17 and is located on the upper end surface of the support plate 17.

The other flexible transparent sheet substrate 11b is disposed on the other surface 19 of the support plate 17. The other flexible transparent sheet substrate 11b draws an arc with a predetermined radius of curvature so as to project toward the front in accordance with the curvature of the other surface 19 of the support plate 17, and the other surface 13 is mounted on the other surface 19 of the support plate 17 by predetermined bonding means (an adhesive or an adhesive tape) (not shown). The end portion 16 on which the electronic control module of the other flexible transparent sheet substrate 11b is mounted is bent on the lower end portion 21 of the support plate 17 and is located on the lower end surface of the support plate 17. The flexible transparent sheet substrate may be mounted only on either one (one surface) of the one surface 18 and the other surface 19 of the support plate 17.

In the LED display 10C, the image (full-color moving image or full-color still image) created by the controller is transmitted from the controller to the electronic control module, and the electronic control module adjusts the brightness of those LED elements 14 while adjusting the luminescent colors of those LED elements 14 and displays the predetermined image (full-color moving image or full-color still image) on the one surface 12 of the flexible transparent sheet substrates 11a and 11b. In the LED display 10C, the image can be displayed on the both surfaces (the one surface 18 and the other surface 19) of the support plate 17 curved with a predetermined radius of curvature and moreover, the image can be also displayed only on one surface (either one surface of the one surface 18 and the other surface 19) of the support plate 17.

The LED display 10C can be used as a panel plate for advertisement such as a poster panel, an exhibition panel, a partition panel and the like which can be installed at an arbitrary place and are curved with the predetermined radius of curvature and can be used as a transmission medium for transmitting various types of information on goods and services by displaying the predetermined image on the both surfaces or the one surface of the support plate 17 curved with a predetermined radius of curvature.

In the LED display 10C, since those flexible transparent sheet substrates 11a and 11b curved with the predetermined radius of curvature and the support plate 17 curved with the predetermined radius of curvature are transparent, during display of the predetermined moving image or still image on the one surface 12 of at least either one of the substrates 11a and 11b in the flexible transparent sheet substrates 11a and 11b by using the plurality of LED elements 14, the scene (sight) on the opposite side (side of the other surface 19 of the support plate 17) can be visually recognized from the side of the one surface 18 of the support plate 17 (LED display 10C), and the scene (sight) on the opposite side (side of the one surface 18 of the support plate 17) can be visually recognized from the side of the other surface 19 of the support plate 17 (LED display 10C).

When the scene (sight) on the opposite side can be visually recognized from the side of the one surface 18 and the side of the other surface 19 of the support plate (LED display 10C) curved with a predetermined radius of curvature during display of the predetermined moving image or still image, not only that the LED display 10C can be installed at an arbitrary place and can display the predetermined moving image or still image on the one surface or the both surfaces of the support plate 17 which are curved with a predetermined radius of curvature, but also that, during display of the predetermined moving image or still image, the scene on the opposite side can be visually recognized from the side of the one surface 18 of the support plate 17, the scene on the opposite side can be visually recognized from the side of the other surface 19 of the support plate 17, the closed feeling is not given, and the predetermined moving image or still image can be shown in the open environment by using the LED display 10C.

In the LED display 10C, the scene on the opposite side can be visually recognized from the side of the surface of the support plate 17 not displaying the moving image or still image during display of the predetermined moving image or still image on the one surface 12 of the flexible transparent sheet substrates 11a and 11b, but the scene on the opposite side can be made visually unrecognizable from the side of the surface of the support plate 17 displaying the moving image or still image by increasing density of the luminance colors (colors) of those LED elements 14 and by increasing brightness of those LED elements 14, by using those LED elements 14.

When the scene on the opposite side cannot be visually recognized from the side of the surface of the support plate 17 displaying the moving image or still image and the scene on the opposite side can be visually recognized from the side of the surface of the support plate 17 not displaying the moving image or still image during display of the predetermined moving image or still image on the one surface 12 of the flexible transparent sheet substrates 11a and 11b by using those LED elements 14, not only that the LED display 10C can be installed at an arbitrary place and can display the predetermined moving image or still image on the one surface or the both surfaces of the support plate 17 curved with the predetermined radius of curvature but also that, during display of the predetermined moving image or still image, the scene on the opposite side can be visually recognized from the side of the surface of the support plate 17 not displaying the moving image or still image, the state on the opposite side can be known from the side of the surface of the support plate 17 not displaying the moving image or still image, the state on the side of the surface of the support plate 17 not displaying the moving image or still image can be hidden by making the scene on the opposite side visually unrecognizable from the side of the surface of the support plate 17 displaying the moving image or still image, and the side of the surface of the support plate 17 not displaying the moving image or still image can be used as a private space or a secret space.

In the LED display 10C, even if the support plate 17 is curved with the predetermined radius of curvature, the flexible transparent sheet substrates 11a and 11b having flexibility can be curved in accordance with the radius of curvature and thus, the flexible transparent sheet substrates 11a and 11b can be mounted on the support plate 17 curved with the predetermined radius of curvature, the LED displays 10C with various curved shapes can be made, and the predetermined moving image or still image can be displayed on the one surface or the both surfaces in the support plate 17 curved in various ways.

Figure 6:
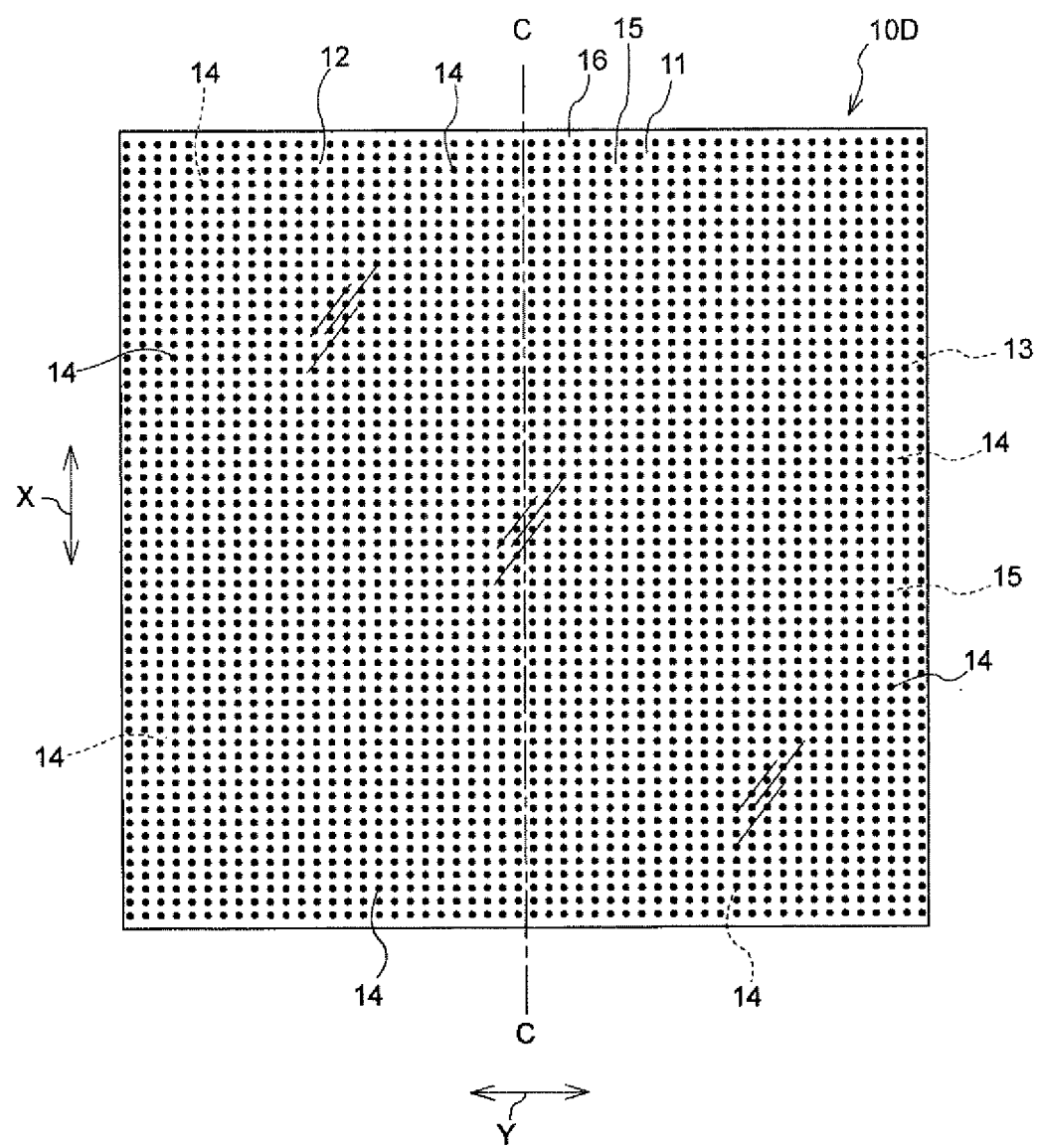
FIG. 6 is a perspective view of the LED display illustrated as another example.
Figure 7:
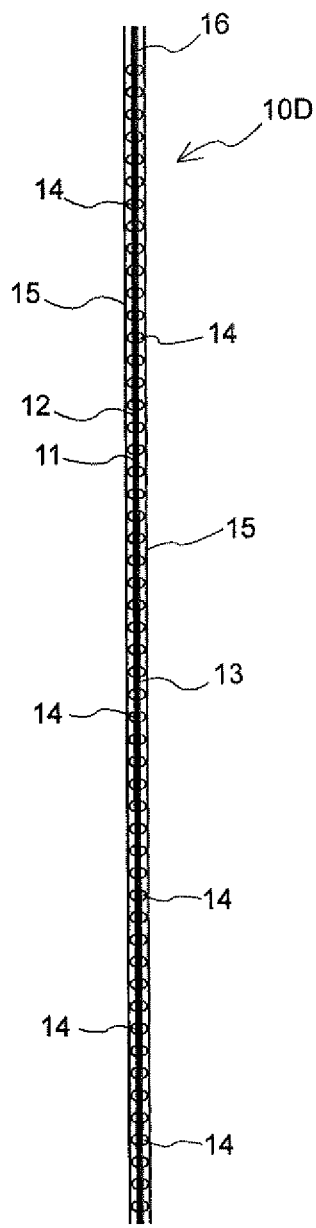
FIG. 7 is a C-C line end surface diagram of FIG. 6.

FIG. 6 is a perspective view of an LED display 10D illustrated as another example, and FIG. 7 is a C-C line end surface view of FIG. 6. In FIG. 6, the vertical direction is indicated by the arrow X, and the lateral direction is indicated by the arrow Y. The LED display 10D illustrated in FIG. 6 is formed by the transparent (colorless and transparent or colored and transparent, preferably colorless and transparent) flexible transparent sheet substrate 11 of a predetermined area, a plurality of LED elements 14 (LED chips) disposed on the one surface 12 and the other surface 13 of the flexible transparent sheet substrate 11, the transparent (colorless and transparent or colored and transparent, preferably colorless and transparent) ultraviolet-ray shielding protective film 15, and an electronic control module (not shown) installed on the end portion 16 of the flexible transparent sheet substrate 11.

The flexible transparent sheet substrate 11 is a transparent sheet (plastic sheet) of a predetermined area having flexibility and made of a synthetic resin (thermoplastic synthetic resin), can be curved into an arc shape with a predetermined radius of curvature and can be bent (folded) at a predetermined angle. Therefore, the LED display 10D has flexibility and the LED display 10D can be curved into an arc shape with the predetermined radius of curvature and can be bent (folded) at the predetermined angle. The flexible transparent sheet substrate 11 has the thickness dimension within a range from 0.2 to 1.5 mm.

Those LED elements 14 are orderly aligned by being separated at an equal interval in the vertical direction on the one surface 12 and the other surface 13 of the flexible transparent sheet substrate 11 and are orderly aligned by being separated at an equal interval in the lateral direction. Those LED elements 14 are installed/fixed on the one surface 12 and the other surface 13 of the flexible transparent sheet substrate 11 in the aligned state vertically and laterally. Those LED elements 14 are electrically connected to each other and are electrically connected to an electronic control module.

Those LED elements 14 have super-high brightness of 6000 to 10000 mcd and have a wide angle of beam spread. The number of ELD elements 14 disposed per unit area (10 mm×10 mm) on the one surface 12 and the other surface 13 of the flexible transparent sheet substrate 11 is 1 to 6. Those LED elements 14 are divided into blocks by the predetermined number (by a predetermined area of the flexible transparent sheet substrate 11) and form first to n-th blocks. Those LED elements 14 constitute pixels of a predetermined pattern on the one surface 12 and the other surface 13 of the flexible transparent sheet substrate 11.

The ultraviolet-ray shielding protective film 15 is a transparent film (plastic film) having flexibility and made of a synthetic resin (thermoplastic synthetic resin) and is molded to substantially the same shape and size of the flexible transparent sheet substrate 11. The ultraviolet-ray shielding protective film 15 is disposed on the one surface 12 and the other surface 13 of the flexible transparent sheet substrate 11 and is bonded to the one surface 12 and the other surface 13 of the flexible transparent sheet substrate 11 by predetermined bonding means (an adhesive, an adhesive tape, sewing and the like) (not shown). The ultraviolet-ray shielding protective film 15 jackets (covers) those LED elements 14 disposed on the one surface 12 and the other surface 13 of the flexible transparent sheet substrate 11. The ultraviolet-ray shielding protective film 15 shields the ultraviolet ray and prevents the ultraviolet ray to reach those LED elements 14, prevents contact between those LED elements 14 and external objects, and protects those LED elements 14 from damage. The electronic control module is the same as that of FIG. 1 and is connected to the controller (not shown). The controller is the same as that of FIG. 1.

In the LED display 10D, the image (full-color moving image or full-color still image) created by the controller is transmitted from the controller to the electronic control module, and the electronic control module adjusts the brightness of those LED elements 14 while adjusting the luminescent colors of those LED elements 14 and displays the predetermined image (full-color moving image or full-color still image) on the one surface 12 and the other surface 13 of the flexible transparent sheet substrate 11. In the LED display 10D, the image can be displayed on the both surfaces (the one surface 12 and the other surface 13) of the flexible transparent sheet substrate 11 and moreover, the image can be also displayed only on one surface (either one surface of the one surface 12 and the other surface 13) of the flexible transparent sheet substrate 11.

The LED display 10D can be used as an advertisement medium which can be installed at an arbitrary place and can be used as a transmission medium for transmitting various types of information on goods and services by being installed on a transparent window pane having a perpendicular surface or a curved surface, a transparent poster panel having a perpendicular surface or a curved surface, a transparent exhibition panel having a perpendicular surface or a curved surface, and a transparent partition panel having a perpendicular surface or a curved surface and by displaying the predetermined image on one surface of the flexible transparent sheet substrate.

In the LED display 10D, since the flexible transparent sheet substrate 11 is transparent, during display of the predetermined moving image or still image on at least one surface in the one surface 12 and the other surface 13 of the flexible transparent sheet substrate 11 (the both surfaces or the one surface of the flexible transparent sheet substrate 11) by using the plurality of LED elements 14, a scene (sight) on the opposite side (the side of the other surface 13 of the flexible transparent sheet substrate 11) can be visually recognized from the side of the one surface 12 of the flexible transparent sheet substrate 11 (LED display 10D), and the scene (sight) on the opposite side (the side of the one surface 12 of the flexible transparent sheet substrate 11) can be visually recognized from the side of the other surface 13 of the flexible transparent sheet substrate 11 (LED display 10D).

When the scene (sight) on the opposite side can be visually recognized from the side of the one surface 12 and the side of the other surface 13 of the flexible transparent sheet substrate 11 (LED display 10D) during display of a predetermined moving image or still image, not only that the LED display 10D can be installed at an arbitrary place and can display the predetermined moving image or still image on at least one surface of the one surface 12 and the other surface 13 of the flexible transparent sheet substrate 11 but also that the scene on the opposite side can be seen from the side of the one surface 12 and the side of the other surface 13 of the flexible transparent sheet substrate 11 during display of the predetermined moving image or still image, a closed feeling is not given, and the predetermined moving image or still image can be shown in an open environment by using the LED display 10D.

In the LED display 10D, the scene on the opposite side can be visually recognized from the side of the surface of the flexible transparent sheet substrate 11 not displaying the moving image or still image by increasing density of the luminance colors (colors) of those LED elements 14 and by increasing brightness of those LED elements 14 during display of the predetermined moving image or still image on at least one surface of the one surface 12 and the other surface 13 of the flexible transparent sheet substrate 11 by using the those LED elements 14, but the scene on the opposite side can be made visually unrecognizable from the side of the surface of the flexible transparent sheet substrate 11 displaying the moving image or still image.

When the scene on the opposite side cannot be visually recognized from the side of the surface of the flexible transparent sheet substrate 11 displaying the moving image or still image, and the scene on the opposite side can be visually recognized from the side of the surface of the flexible transparent sheet substrate 11 not displaying the moving image or still image during display of the predetermined moving image or still image by using those LED elements 14, not only that the LED display 10D can be installed at an arbitrary place and can display the predetermined moving image or still image on at least one surface of the one surface 12 and the other surface 13 of the flexible transparent sheet substrate 11 but also that, during display of the predetermined moving image or still image, the scene on the opposite side can be visually recognized from the side of the surface of the flexible transparent sheet substrate 11 not displaying the moving image or still image, the state on the opposite side can be known from the side of the surface of the flexible transparent sheet substrate 11 not displaying the moving image or still image, and the state on the side of the surface of the flexible transparent sheet substrate 11 not displaying the moving image or still image can be hidden by making the scene on the opposite side visually unrecognizable from the side of the surface of the flexible transparent sheet substrate 11 displaying the moving image or still image, and the side of the surface of the flexible transparent sheet substrate 11 not displaying the moving image or still image can be used as a private space or a secret space.

Figure 8:
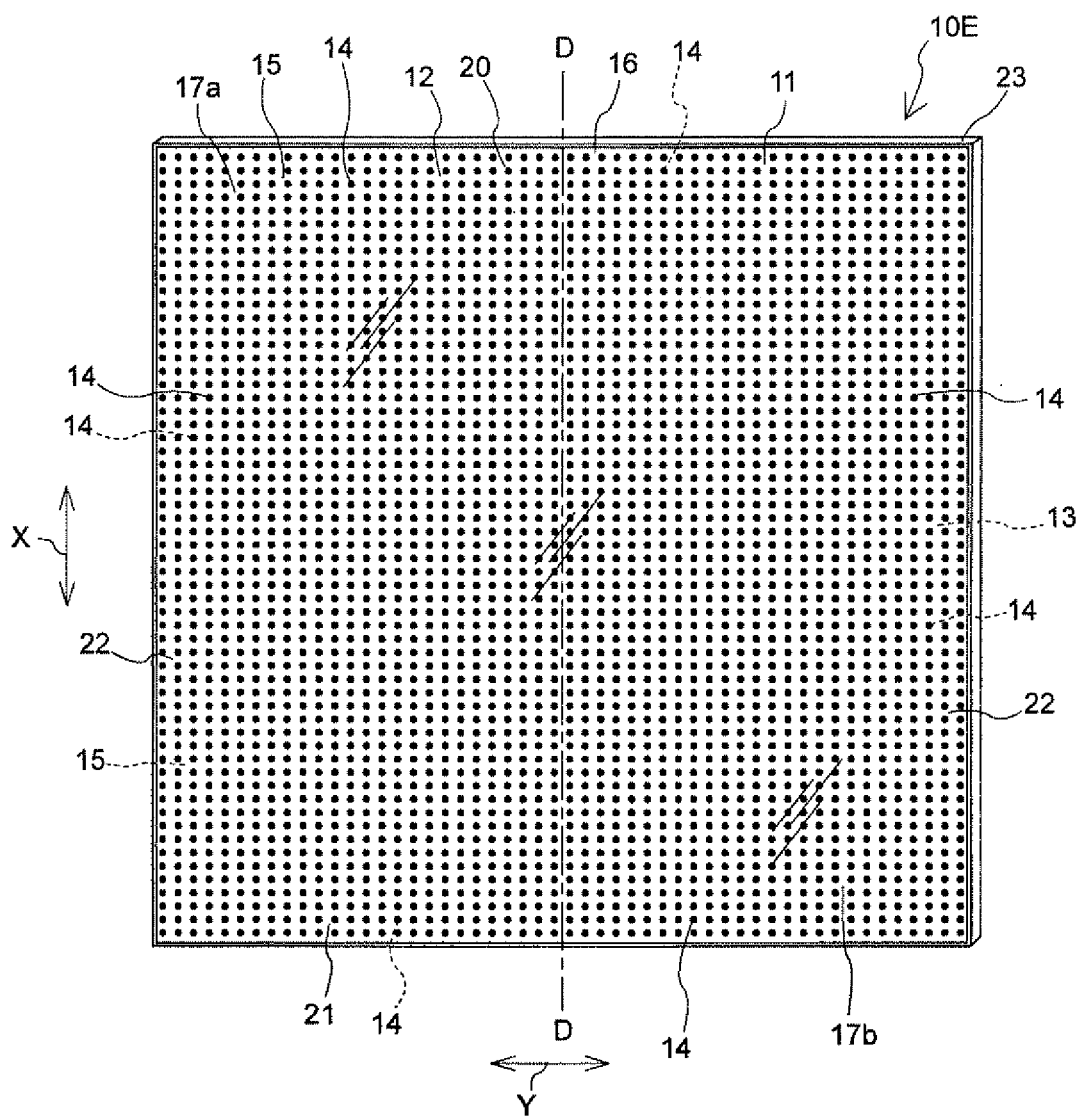
FIG. 8 is a perspective view of the LED display illustrated as another example.
Figure 9:
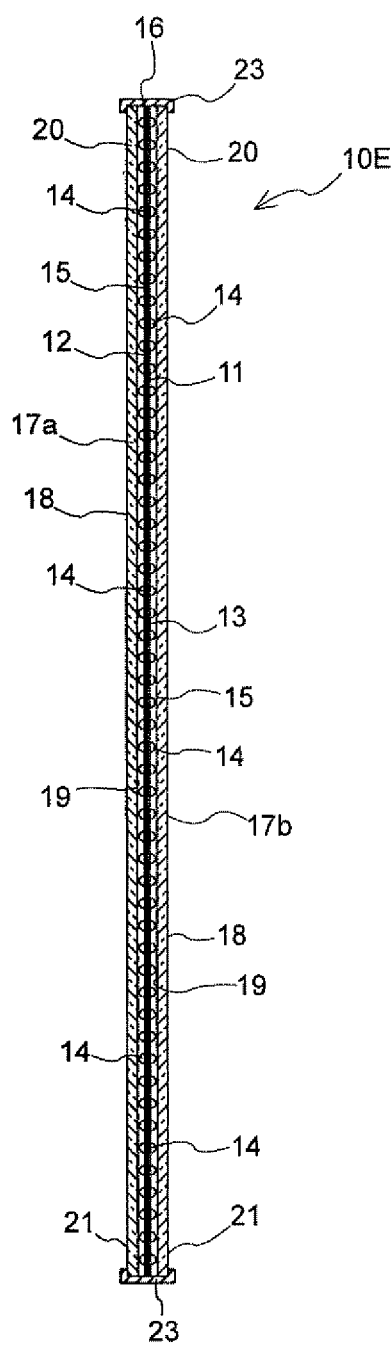
FIG. 9 is a D-D line end surface diagram of FIG. 8.

FIG. 8 is a perspective view of an LED display 10E illustrated as another example, and FIG. 9 is a D-D line end surface view of FIG. 8. In FIG. 8, the vertical direction is indicated by the arrow X, and the lateral direction is indicated by the arrow Y. The LED display 10E illustrated in FIG. 8 is formed by the transparent (colorless and transparent or colored and transparent, preferably colorless and transparent) flexible transparent sheet substrate 11, a plurality of LED elements 14 (LED chips) disposed on the one surface 12 and the other surface 13 of the flexible transparent sheet substrate 11, the transparent (colorless and transparent or colored and transparent, preferably colorless and transparent) ultraviolet-ray shielding protective film 15, an electronic control module (not shown) installed on the end portion 16 of the flexible transparent sheet substrate 11, a transparent (colorless and transparent or colored and transparent, preferably colorless and transparent) first support plate 17a of a predetermined area, and a transparent (colorless and transparent or colored and transparent, preferably colorless and transparent) second support plate 17b of a predetermined area.

The flexible transparent sheet substrate 11 is a transparent sheet (plastic sheet) of a predetermined area having flexibility and made of a synthetic resin (thermoplastic synthetic resin), can be curved into an arc shape with a predetermined radius of curvature and can be bent (folded) at a predetermined angle. The flexible transparent sheet substrate 11 has the thickness dimension within a range from 0.2 to 1.5 mm. Those LED elements 14 are orderly aligned by being separated at an equal interval in the vertical direction on the one surface 12 and the other surface 13 of the flexible transparent sheet substrate 11 and are orderly aligned by being separated at an equal interval in the lateral direction. Those LED elements 14 are installed/fixed on the one surface 12 and the other surface 13 of the flexible transparent sheet substrate 11 in the aligned state vertically and laterally. Those LED elements 14 are electrically connected to each other and are electrically connected to the electronic control module.

Those LED elements 14 have super-high brightness of 6000 to 10000 mcd and have a wide angle of beam spread. The number of LED elements 14 disposed per unit area (10 mm×10 mm) on the one surface 12 and the other surface 13 of the flexible transparent sheet substrate 11 is 1 to 6. Those LED elements 14 are divided into blocks by the predetermined number (by a predetermined area of the flexible transparent sheet substrate 11) and form first to n-th blocks. Those LED elements 14 constitute pixels of a predetermined pattern on the one surface 12 and the other surface 13 of the flexible transparent sheet substrate 11.

The ultraviolet-ray shielding protective film 15 is molded to substantially the same shape and size of the flexible transparent sheet substrate 11 and is mounted on the one surface 12 and the other surface 13 of those flexible transparent sheet substrates 11. The ultraviolet-ray shielding protective film 15 is the same as that in FIG. 1, jackets (covers) those LED elements 14 disposed on the one surface 12 and the other surface 13 of the flexible transparent sheet substrate 11, prevents the ultraviolet ray to reach those LED elements 14, prevents contact between those LED elements 14 and external objects, and protects those LED elements 14 from damage. The electronic control module is the same as that of FIG. 1 and is connected to the controller (not shown). The controller is the same as that of FIG. 1.

The first support plate 17a and the second support plate 17b have the flat one surface 18 (outer surface) and the flat other surface 19 (inner surface) and extend linearly in the lateral direction and the vertical direction. The first support plate 17a and the second support plate 17b are a plastic plate made of a synthetic resin (thermoplastic synthetic resin), and a transparent acrylic plate is used. Other than the acrylic plate, a transparent vinyl chloride plate, a transparent polycarbonate plate, and a transparent PET plate can be also used for those support plates 17a and 17b. Those support plates 17a and 17b have the thickness dimension within a range from 5 to 10 mm. On the upper and lower end portions 20 and 21 and the both side edge portions 22 (peripheral edge portions) of those support plates 17a and 17b, the frame 23 surrounding those edge portions 20 to 22 is installed.

The flexible transparent sheet substrate 11 is disposed between the other surface 19 of the first support plate 17a and the other surface 19 of the second support plate 17b, and the first support plate 17a is faced with the one surface 12 of the flexible transparent sheet substrate 11, while the second support plate 17b is faced with the other surface 13 of the flexible transparent sheet substrate 11. In the flexible transparent sheet substrate 11, the one surface 12 is mounted on the other surface 19 (inner surface) of the first support plate 17a by predetermined bonding means (an adhesive or an adhesive tape) (not shown), and the other surface 13 is mounted on the other surface 19 (inner surface) of the second support plate 17b by predetermined bonding means (an adhesive or an adhesive tape) (not shown). The end portion 16 on which the electronic control module of the flexible transparent sheet substrate 11 is mounted is bent on the upper end portion 20 of the first support plate 17a and is located on an upper end surface of the first support plate 17a.

In the LED display 10E, the image (full-color moving image or full-color still image) created by the controller is transmitted from the controller to the electronic control module, and the electronic control module adjusts the brightness of those LED elements 15 while adjusting the luminescent colors of those LED elements 14 and displays the predetermined image (full-color moving image or full-color still image) on the outer surfaces (one surfaces 18) of the first support plate 17a and the second support plate 17b (the one surface 12 and the other surface 13 of the flexible transparent sheet substrate 11). In the LED display 10D, the image can be displayed on the outer surfaces (one surfaces 18) of those support plates 17a and 17b (the both surfaces of the flexible transparent sheet substrate 11) and moreover, the image can be also displayed only on the outer surface (one surface 18) (one surface of the flexible transparent sheet substrate 11) of either one of the first support plate 17a and the second support plate 17b.

The LED display 10E can be used as a panel plate for advertisement such as a poster panel, an exhibition panel, a partition panel and the like which can be installed at an arbitrary place and can be used as a transmission medium for transmitting various types of information on goods and services by displaying the predetermined image on the outer surface (one surface 18) of at least either one of the first support plate 17a and the second support plate 17b (at least either one surface of the one surface 12 and the other surface 13 of the flexible transparent sheet substrate 11).

In the LED display 10E, since the flexible transparent sheet substrate 11 and the first and second support plates 17a and 17b are transparent, during display of the predetermined moving image or still image on at least one surface in the one surface 12 and the other surface 13 of the flexible transparent sheet substrate 11 (at least either one of the first support plate 17a and the second support plate 17b) by using the plurality of LED elements 14, a scene (sight) on the opposite side (the side of the outer surface of the second support plate 17b) can be visually recognized from the side of the outer surface (one surface 18) of the first support plate 17a (LED display 10E), and the scene (sight) on the opposite side (the side of the outer side of the first support plate 17a) can be visually recognized from the side of the outer surface (one surface 18) of the second support plate 17b (LED display 10E).

When the scene (sight) on the opposite side can be visually recognized from the side of the outer surface of the first support plate 17a (LED display 10E), and the scene (sight) on the opposite side can be visually recognized from the side of the outer surface of the second support plate 17b (LED display 10E) during display of the predetermined moving image or still image, not only that the LED display 10E can be installed at an arbitrary place and can display the predetermined moving image or still image on the outer surface (one surface 18) of at least either one of the first support plate 17a and the second support plate 17b, but also, during display of the predetermined moving image or still image, that the scene on the opposite side can be visually recognized from the side of the outer surface of the first support plate 17a and the scene on the opposite side can be visually recognized from the side of the outer surface of the second support plate 17b closed feeling is not given, and the predetermined moving image or still image can be shown in the open environment by using the LED display 10E.

In the LED display 10E, the scene on the opposite side can be visually recognized from the side of the outer surface (surface) of the support plates 17a and 17b not displaying the moving image or still image in the first and second support plates 17a and 17b during display of the predetermined moving image or still image on at least one surface of the one surface 12 and the other surface 13 of the flexible transparent sheet substrate 11 by using those LED elements 14 by increasing density of the luminance colors (colors) of those LED elements 14 and by increasing brightness of those LED elements 14, but the scene on the opposite side can be made visually unrecognizable from the side of the outer surface (surface) of the support plates 17a and 17b displaying the moving image or still image in the first and second support plates 17a and 17b in the first and second support plates 17a and 17b.

When the scene on the opposite side cannot be visually recognized from the side of the outer surface (one surface 18) of the support plates 17a and 17b displaying the moving image or still image in the first and second support plates 17a and 17b, and the scene on the opposite side can be visually recognized from the side of the outer surface (one surface 18) of the support plates 17a and 17b not displaying the moving image or still image in the first and second support plates 17a and 17b during display of the predetermined moving image or still image by using those LED elements 14, not only that the LED display 10E can be installed at an arbitrary place and can display the predetermined moving image or still image on the outer surface of at least either one of the first support plate 17a and the second support plate 17b, but also that, during display of the predetermined moving image or still image, the scene on the opposite side can be visually recognized from the side of the surface of the support plates 17a and 17b not displaying the moving image or still image and the state on the opposite side can be known from the side of the surface of the support plates 17a and 17b not displaying the moving image or still image, the state on the side of the surface of the support plates 17a and 17b not displaying the moving image or still image can be hidden by making the scene on the opposite side visually unrecognizable from the side of the surface of the support plates 17a and 17b not displaying the moving image or still image, and the side of the surface of the support plates 17a and 17b not displaying the moving image or still image can be used as a private space or a secret space.

Figure 10:
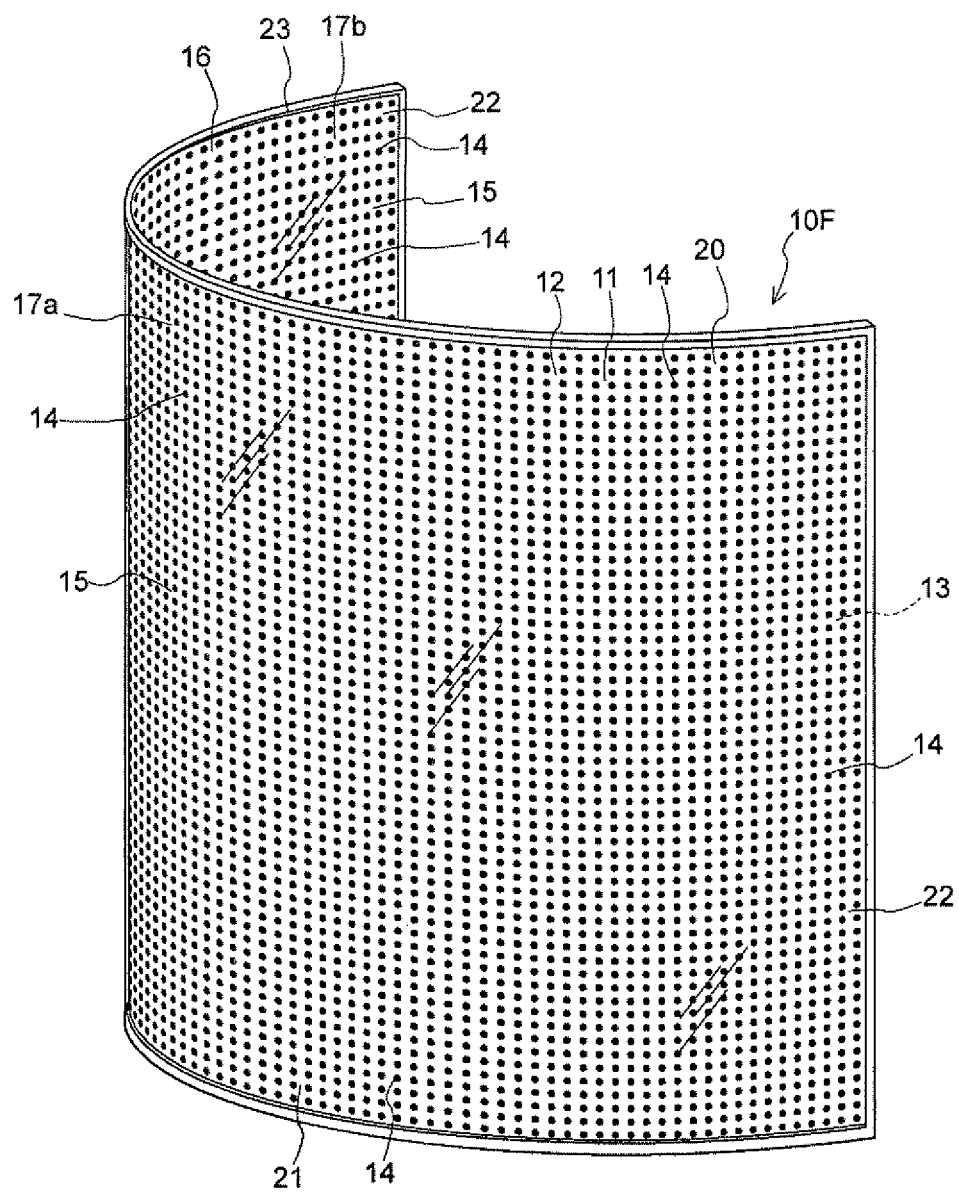
FIG. 10 is a perspective view of the LED display illustrated as another example.

FIG. 10 is a perspective view of an LED display 10F illustrated as another example. The LED display 10F illustrated in FIG. 10 is formed by the transparent (colorless and transparent or colored and transparent, preferably colorless and transparent) flexible transparent sheet substrate 11 of a predetermined area, a plurality of LED elements 14 (LED chips) disposed on the one surface 12 and the other surface 13 of the flexible transparent sheet substrate 11, the transparent (colorless and transparent or colored and transparent, preferably colorless and transparent) ultraviolet-ray shielding protective film 15, an electronic control module (not shown) installed on the end portion 16 of the flexible transparent sheet substrate 11, the transparent (colorless and transparent or colored and transparent, preferably colorless and transparent) first support plate 17a of a predetermined area, and the transparent (colorless and transparent or colored and transparent, preferably colorless and transparent) second support plate 17b of a predetermined area.

The flexible transparent sheet substrate 11 and those LED elements 14 are the same as those in FIGS. 6 and 8. The ultraviolet-ray shielding protective film 15 is molded to substantially the same shape and size of the flexible transparent sheet substrate 11 and is mounted on the one surface 12 and the other surface 13 of the flexible transparent sheet substrate 11. The ultraviolet-ray shielding protective film 15 is the same as that in FIG. 1 and jackets (covers) those LED elements 14 disposed on the one surface 12 and the other surface 13 of the flexible transparent sheet substrate 11, prevents the ultraviolet ray to reach those LED elements 14, prevents contact between those LED elements 14 and external objects, and protects those LED elements 14 from damage. The electronic control module is the same as that of FIG. 1 and is connected to the controller (not shown). The controller is the same as that in FIG. 1.

The first support plate 17a and the second support plate 17b have the one surface 18 curved with a predetermined radius of curvature and the other surface 19 curved with a predetermined radius of curvature and draw an arc having a predetermined radius of curvature so as to project toward the front thereof. The first support plate 17a and the second support plate 17b are a plastic plate made of a synthetic resin (thermoplastic synthetic resin), and a transparent acrylic plate is used. Other than the acrylic plate, a transparent vinyl chloride plate, a transparent polycarbonate plate, and a transparent PET plate can be also used for those support plates 17a and 17b. Those support plates 17a and 17b have the thickness dimension within a range from 5 to 10 mm. On the upper and lower end portions 20 and 21 and the both side edge portions 22 (peripheral edge portions) of the support plates 17a and 17b, the frame 23 surrounding those edge portions 20 to 22 is installed/fixed.

The flexible transparent sheet substrate 11 is disposed between the other surface 19 of the first support plate 17a and the other surface 19 of the second support plate 17b, the first support plate 17a is faced with the one surface 12 of the flexible transparent sheet substrate 11, and the second support plate 17b is faced with the other surface 13 of the flexible transparent sheet substrate 11. The flexible transparent sheet substrate 11 draws an arc with a predetermined radius of curvature so as to project toward the front in accordance with the curvatures of the other surface 19 of the first support plate 17a and the other surface 19 of the second support plate 17b.

In the flexible transparent sheet substrate 11, the one surface 12 is mounted on the other surface 19 (inner surface) of the first support plate 17a by predetermined bonding means (an adhesive or an adhesive tape) (not shown), and the other surface 13 is mounted on the other surface 19 (inner surface) of the second support plate 17b by predetermined bonding means (an adhesive or an adhesive tape) (not shown). The end portion 16 on which the electronic control module of the flexible transparent sheet substrate 11 is mounted is bent on the upper end portion 20 of the first support plate 17a and is located on the upper end surface of the first support plate 17a.

In the LED display 10F, the image (full-color moving image or full-color still image) created by the controller is transmitted from the controller to the electronic control module, and the electronic control module adjusts the brightness of those LED elements 14 while adjusting the luminescent colors of those LED elements 14 and displays the predetermined image (full-color moving image or full-color still image) on the outer surface (one surface 18) (the one surface 12 and the other surface 13 of the flexible transparent sheet substrate 11) of the first support plate 17a and the second support plate 17b. In the LED display 10F, the image can be displayed on the outer surfaces (the both surfaces of the flexible transparent sheet substrate) of those support plates 17a and 17b curved with the predetermined radius of curvature and moreover, the image can be also displayed only on the outer surface (one surface of the flexible transparent sheet substrate) of either one of the first support plate 17a and the second support plate 17b.

The LED display 10F can be used as a panel plate for advertisement such as a poster panel, an exhibition panel, a partition panel and the like which can be installed at an arbitrary place and are curved with the predetermined radius of curvature and can be used as a transmission medium for transmitting various types of information on goods and services by displaying the predetermined image on one outer surface (one surface 18) of at least one of the first support plate 17a and the second support plate 17b curved with the predetermined radius of curvature (at least one surface of the one surface 12 and the other surface 13 of the flexible transparent sheet substrate 11).

In the LED display 10F, since the flexible transparent sheet substrates 11 curved with the predetermined radius of curvature and the first and second support plates 17a and 17b curved with the predetermined radius of curvature are transparent, during display of the predetermined moving image or still image on at least one surface of the one surface 12 and the other surface 13 of the flexible transparent sheet substrate 11 (at least one of the outer surfaces of the first support plate 17a and the second support plate 17b) by using the plurality of LED elements 14, the scene (sight) on the opposite side (side of the outer surface of the second support plate 17b) can be visually recognized from the side of the outer surface (one surface 18) of the first support plate 17a

(LED display 10F), and the scene (sight) on the opposite side (side of the outer surface of the first support plate 17a) can be visually recognized from the side of the outer surface (one surface 18) of the second support plate 17b (LED display 10F).

When the scene (sight) on the opposite side can be visually recognized from the side of the outer surface of the first support plate 17a (LED display 10F) curved with the predetermined radius of curvature and the scene (sight) on the opposite side can be visually recognized from the side of the outer surface of the second support plate 17b (LED display 10F) curved with the predetermined radius of curvature during display of the predetermined moving image or still image, not only that the LED display 10E can be installed at an arbitrary place and can display the predetermined moving image or still image on the outer surface of at least either one of the first support plate 17a and the second support plate 17b curved with the predetermined radius of curvature, but also that, during display of the predetermined moving image or still image, the scene on the opposite side can be visually recognized from the side of the outer surface of the first support plate 17a and the scene on the opposite side can be visually recognized from the side of the outer surface of the second support plate 17b, closed feeling is not given, and the predetermined moving image or still image can be shown in the open environment by using the LED display 10F.

In the LED display 10F, the scene on the opposite side can be visually recognized from the side of the outer surface (surface) of the support plates 17a and 17b not displaying the moving image or still image in the first and second support plates 17a and 17b during display of the predetermined moving image or still image on at least one surface of the one surface 12 and the other surface 13 of the flexible transparent sheet substrate 11 by using those LED elements 14 by increasing density of the luminance colors (colors) of those LED elements 14 and by increasing brightness of those LED elements 14, but the scene on the opposite side can be made visually unrecognizable from the side of the outer surface (surface) of the support plates 17a and 17b displaying the moving image or still image in the first and second support plates 17a and 17b.

When the scene on the opposite side cannot be visually recognized from the side of the outer surface of the support plates 17a and 17b displaying the moving image or still image in the first and second support plates 17a and 17b, and the scene on the opposite side can be visually recognized from the side of the outer surface of the support plates 17a and 17b not displaying the moving image or still image in the first and second support plates 17a and 17b during display of the predetermined moving image or still image by using those LED elements 14, not only that the LED display 10F can be installed at an arbitrary place and can display the predetermined moving image or still image on the outer surface of at least either one of the first support plate 17a and the second support plate 17b curved with the predetermined radius of curvature, but also that, during display of the predetermined moving image or still image, the scene on the opposite side can be visually recognized from the side of the surface of the support plates 17a and 17b not displaying the moving image or still image, the state on the opposite side can be known from the side of the surfaces of the support plates 17a and 17b not displaying the moving image or still image, and the state on the side of the surface of the support plates 17a and 17b not displaying the moving image or still image can be hidden by making the scene on the opposite side visually unrecognizable from the side of the surface of the support plates 17a and 17b displaying the moving image or still image, and the side of the surface of the support plates 17a and 17b not displaying the moving image or still image can be used as a private space or a secret space.

In the LED display 10F, even if the first and second support plates 17a and 17b are curved with the predetermined radius of curvature, the flexible transparent sheet substrate 11 having flexibility can be curved in accordance with the radius of curvature and thus, the flexible transparent sheet substrate 11 can be mounted on the first and second support plates 17a and 17b by disposing the flexible transparent sheet substrate 11 between the first and second support plates 17a and 17b curved with the predetermined radius of curvature, the LED displays 10F with various curved shapes can be made, and the predetermined moving image or still image can be displayed on the outer surfaces of the first support plate 17a and the second support plate 17b curved in various ways.

REFERENCE SIGNS LIST

10A LED display
10B LED display
10C LED display
10D LED display
10E LED display
10F LED display
11 flexible transparent sheet substrate
11a flexible transparent sheet substrate
11b flexible transparent sheet substrate
12 one surface
13 the other surface plate
14 LED element
15 ultraviolet-ray shielding protective film
16 end portion
17 support plate
17a first support plate
17b second support plate
18 one surface
19 the other surface
20 upper end portion
21 lower end portion
22 both side edge portion
23 frame

The invention claimed is:
1. An LED display comprising:
a transparent flexible transparent sheet substrate of a predetermined area having flexibility; and
a plurality of LED elements installed on one of surfaces of the flexible transparent sheet substrate, wherein
the plurality of LED elements is disposed in a predetermined number per unit area of the flexible transparent sheet substrate so as to configure pixels of a predetermined pattern;
a predetermined moving image or still image is displayed on one of the surfaces of the flexible transparent sheet substrate by using the plurality of LED elements;
a scene on an opposite side cannot be visually recognized from the one surface side of the flexible transparent sheet substrate and the scene on the opposite side can be visually recognized from the other surface side of the flexible transparent sheet substrate, during display of the predetermined moving image or still image on one of the surfaces of the flexible transparent sheet substrate, by increasing density of luminance colors of the plurality of LED elements and by increasing brightness of the LED elements; and the other surface side of the flexible transparent sheet substrate is used as a private space or a secret space.

2. The LED display according to claim 1, wherein
the LED display includes a transparent support plate of a predetermined area on which the other surface of the flexible transparent sheet substrate is mounted on one surface or both surfaces; and
in the LED display, during display of the predetermined moving image or still image on one of the surfaces of the flexible transparent sheet substrate by using the plurality of LED elements, a scene on an opposite side cannot be visually recognized from a side of the surface of the support plate displaying the moving image or still image, and the scene on the opposite side can be visually recognized from the side of the surface of the support plate not displaying the moving image or still image.

3. The LED display according to claim 2, wherein
the support plate draws an arc having a predetermined radius of curvature so as to project toward at least one of front and rear thereof; and
the flexible transparent sheet substrate is mounted on the support plate while drawing an arc in accordance with the curvature of the support plate.

4. An LED display comprising:
a transparent flexible transparent sheet substrate of a predetermined area having flexibility; and
a plurality of LED elements installed on one surface and the other surface of the flexible transparent sheet substrate, wherein
the plurality of LED elements is disposed in a predetermined number per unit area of the flexible transparent sheet substrate so as to configure pixels of a predetermined pattern;
a predetermined moving image or still image is displayed on at least one of the surfaces of one surface and the other surface of the flexible transparent sheet substrate by using the plurality of LED elements;
a scene on an opposite side cannot be visually recognized from a side of the surface of the flexible transparent sheet substrate displaying the moving image or still image, and the scene on the opposite side can be visually recognized from the side of the surface of the flexible transparent sheet substrate not displaying the moving image or still image, during display of the predetermined moving image or still image on at least one of the surfaces of the one surface and the other surface of the flexible transparent sheet substrate, by increasing density of luminance colors of the plurality of LED elements and by increasing brightness of the LED elements; and
the other surface side of the flexible transparent sheet substrate is used as a private space or a secret space.

5. The LED display according to claim 4, wherein
the LED display includes a transparent first support plate having a predetermined area faced with the one of the surfaces of the flexible transparent sheet substrate and a transparent second support plate having a predetermined area faced with the other surface of the flexible transparent sheet substrate; and
in the LED display, during display of the predetermined moving image or still image on at least one surface of the one surface and the other surface of the flexible transparent sheet substrate by using the plurality of LED elements, a scene on an opposite side cannot be visually recognized from a side of the surface of the support plate displaying the moving image or still image in the first and second support plates, and the scene on the opposite side can be visually recognized from the side of the surface of the support plate not displaying the moving image or still image in the first and second support plates.

6. The LED display according to claim 5, wherein
the first support plate and the second support plate draw an arc having a predetermined radius of curvature so as to project toward at least one of front and rear thereof; and
the flexible transparent sheet substrate draws an arc in accordance with the curvature of the first support plate and the second support plate while being disposed between those support plates.

\* \* \* \* \*